US010290595B2

(12) United States Patent
Oshiki

(10) Patent No.: US 10,290,595 B2
(45) Date of Patent: May 14, 2019

(54) THREE-DIMENSIONAL SEMICONDUCTOR MEMORY DEVICE AND METHOD FOR MANUFACTURING THE SAME

(71) Applicant: Toshiba Memory Corporation, Minato-ku (JP)

(72) Inventor: Yusuke Oshiki, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/696,717

(22) Filed: Sep. 6, 2017

(65) Prior Publication Data

US 2018/0277499 A1   Sep. 27, 2018

(30) Foreign Application Priority Data

Mar. 22, 2017  (JP) ................. 2017-056412

(51) Int. Cl.
| | | |
|---|---|---|
| H01L 23/60 | (2006.01) | |
| H01L 27/1157 | (2017.01) | |
| H01L 27/11582 | (2017.01) | |
| H01L 23/522 | (2006.01) | |
| H01L 23/528 | (2006.01) | |
| H01L 23/532 | (2006.01) | |
| H01L 27/11565 | (2017.01) | |
| H01L 27/11575 | (2017.01) | |

(52) U.S. Cl.
CPC ............ *H01L 23/60* (2013.01); *H01L 23/528* (2013.01); *H01L 23/5226* (2013.01); *H01L 23/5329* (2013.01); *H01L 23/53257* (2013.01); *H01L 27/1157* (2013.01); *H01L 27/11565* (2013.01); *H01L 27/11575* (2013.01); *H01L 27/11582* (2013.01)

(58) Field of Classification Search
None
See application file for complete search history.

(56) References Cited

U.S. PATENT DOCUMENTS

| | | | | |
|---|---|---|---|---|
| 8,008,732 | B2 * | 8/2011 | Kiyotoshi | ............ H01L 27/105 257/390 |
| 9,343,405 | B2 | 5/2016 | Matsuda | |
| | | | (Continued) | |

FOREIGN PATENT DOCUMENTS

| | | |
|---|---|---|
| JP | 2014-27104 | 2/2014 |
| JP | 2016-25141 | 2/2016 |
| JP | 2016-62950 | 4/2016 |

*Primary Examiner* — Bilkis Jahan
(74) *Attorney, Agent, or Firm* — Oblon, McClelland, Maier & Neustadt, L.L.P.

(57) ABSTRACT

According to an embodiment, a semiconductor memory device includes a substrate, an insulating film, a plurality of conductive films, an insulating member, a plurality of stacked bodies, and a first member. The insulating member is provided on the insulating film, is positioned between the conductive films in a first direction along the substrate, and extends in a second direction along the substrate, the second direction crossing the first direction. The first member is provided on the insulating member, is positioned between the stacked bodies in the first direction, and extends in a stacking direction of the plurality of electrode films of the stacked bodies. A width in the first direction of the insulating member is larger than a width in the first direction of the first member.

10 Claims, 23 Drawing Sheets

(56) References Cited

U.S. PATENT DOCUMENTS

| | | | |
|---|---|---|---|
| 2011/0216597 A1* | 9/2011 | Higashi | H01L 27/11582 365/185.18 |
| 2012/0168824 A1* | 7/2012 | Lee | H01L 27/11565 257/204 |
| 2013/0134492 A1* | 5/2013 | Yang | H01L 27/1157 257/314 |
| 2014/0027838 A1 | 1/2014 | Kido et al. | |
| 2014/0054672 A1* | 2/2014 | Kim | H01L 29/792 257/324 |
| 2014/0054674 A1* | 2/2014 | Kim | H01L 29/792 257/324 |
| 2015/0079748 A1* | 3/2015 | Kim | H01L 29/792 438/270 |
| 2015/0262826 A1* | 9/2015 | Yun | H01L 27/11578 438/269 |
| 2016/0079069 A1* | 3/2016 | Uenaka | H01L 27/11582 257/326 |

* cited by examiner

THREE-DIMENSIONAL SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No.2017-056412, filed on Mar. 22, 2017; the entire contents of which are incorporated herein by reference.

FIELD

Embodiments of the invention relate generally to a semiconductor memory device and a method for manufacturing the same.

BACKGROUND

In a semiconductor memory device having a three-dimensional structure, in order to increase the degree of integration, a memory hole is formed in a stacked body in which a plurality of electrode films is stacked, and in the memory hole, a charge storage film and a channel are provided extending in a stacking direction of the stacked body. In such a semiconductor memory device, in order to further increase the degree of integration, a structure in which an interconnect is provided directly under the memory hole has been proposed. However, there is a concern that as the number of stacked electrode films is increased, an electric discharge between a substrate and an interconnect occurs resulting from processing of a memory hole or the like.

DETAILED DESCRIPTION

Figure 1:
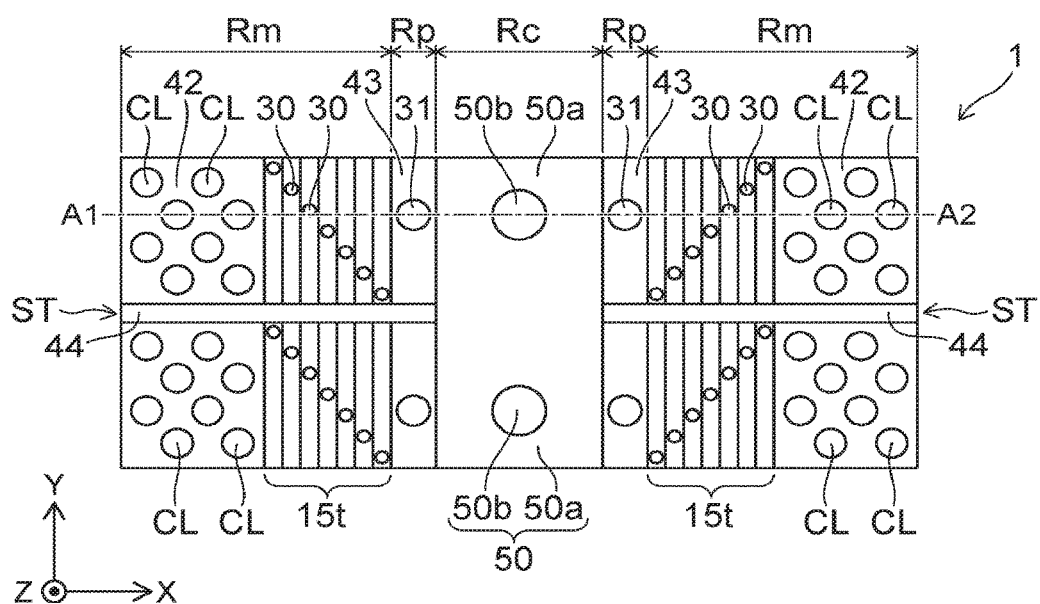
FIG. 1 is a plan view showing a semiconductor memory device according to a first embodiment.

According to an embodiment, a semiconductor memory device includes a substrate, an insulating film, a plurality of conductive films, an insulating member, a plurality of stacked bodies, and a first member. The insulating film is provided on the substrate. The plurality of conductive films is provided on the insulating film. The insulating member is provided on the insulating film, is positioned between the conductive films in a first direction along the substrate, and extends in a second direction along the substrate, the second direction crossing the first direction. The plurality of stacked bodies is provided on the plurality of conductive films, and includes a plurality of electrode films stacked separately from each other. The first member is provided on the insulating member, is positioned between the stacked bodies in the first direction, and extends in a stacking direction of the plurality of electrode films. A width in the first direction of the insulating member is larger than a width in the first direction of the first member.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

(First Embodiment)

FIG. 1 is a plan view showing a semiconductor memory device 1.

Figure 2:
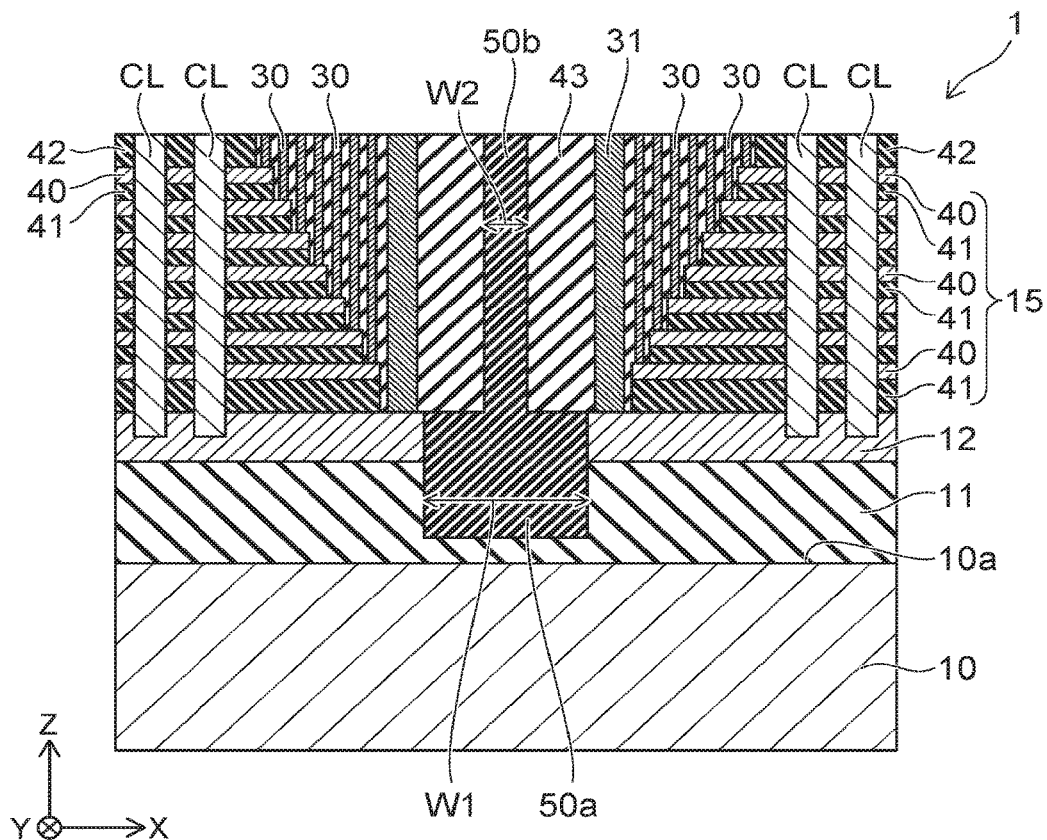
FIG. 2 is a sectional view taken along a line A1-A2 of FIG. 1.

FIG. 2 is a sectional view taken along a line A1-A2 of FIG. 1.

Figure 3:
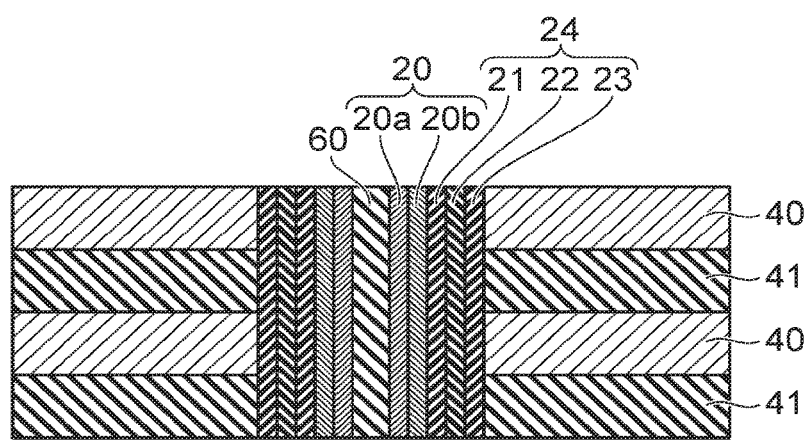
FIG. 3 is a sectional view showing a part of the semiconductor memory device according to the first embodiment.

FIG. 3 is a sectional view showing a columnar portion CL in the semiconductor memory device 1 in an enlarged manner.

In the semiconductor memory device 1 according to the embodiment, a substrate 10 such as a silicon substrate is provided. Hereinafter, in the specification, for the sake of convenience of description, an XYZ orthogonal coordinate system is adopted. Two directions parallel to an upper surface 10a of the substrate 10 and also orthogonal to each other are referred to as "X-direction" and "Y-direction", and a direction perpendicular to the upper surface 10a of the substrate 10 is referred to as "Z-direction". The X-direction corresponds to a first direction, the Y-direction corresponds to a second direction, and the Z-direction corresponds to a stacking direction.

As shown in FIG. 1 and FIG. 2, in the semiconductor memory device 1, a memory cell region Rm, a peripheral region Rp, and a connection region Rc are provided. In an example shown in FIG. 1, each of the peripheral region Rp and the memory cell region Rm is disposed on both sides in the X-direction with respect to the connection region Rc. For example, the arrangement of the memory cell region Rm, the peripheral region Rp, and the connection region Rc as shown in FIG. 1 is arranged periodically in the X-direction.

In the memory cell region Rm, an insulating film 11, a conductive film 12, a stacked body 15, and a plurality of columnar portions CL are provided.

The insulating film 11 is provided on the substrate 10. The insulating film 11 contains, for example, silicon oxide.

A plurality of conductive films 12 is provided on the insulating film 11. The conductive film 12 contains, for example, a metal such as tungsten (W). The conductive film 12 may contain titanium (Ti). The conductive film 12 may also contain a metal compound such as tungsten nitride (WN) or titanium nitride (TiN). Further, the conductive film 12 may contain silicon, and may also be a stacked film of a film containing the above-mentioned metal or metal compound and a film containing polysilicon.

The conductive film 12 constitutes, for example, a part of a source line. For example, in the operation (writing, erasing, and reading operation) of the semiconductor memory device 1, a value of a current flowing in a channel 20 through the conductive film 12 is read.

The stacked body 15 is provided on the conductive film 12. The stacked body 15 includes a plurality of electrode films 40 and a plurality of insulating films 41. A stacking direction of the stacked body 15 corresponds to the Z-direction. For example, in the plurality of electrode films 40, the electrode film 40 being the lowermost layer is a source-side select gate, and the electrode film 40 being the uppermost layer is a drain-side select gate. For example, in the plurality of electrode films 40, the electrode film 40 provided between the electrode film 40 being the lowermost layer (source-side select gate) and the electrode film 40 being the uppermost layer (drain-side select gate) is a word line. Incidentally, the number of the stacked electrode films 40 is arbitrary.

The electrode film 40 contains a conductive material, for example, a metal such as tungsten. The insulating film 41 is provided between the electrode films 40. The insulating film 41 contains, for example, silicon oxide (SiO). On the stacked body 15, an insulating film 42 is provided. The insulating film 42 contains, for example, silicon oxide.

A plurality of columnar portions CL is provided in a center of the stacked body 15. The columnar portion CL extends in the Z-direction in the stacked body 15 and the insulating film 42. The columnar portion CL is formed, for example, in a circular columnar shape or an elliptical columnar shape. The plurality of columnar portions CL is disposed, for example, in a predetermined shape in an X-Y plane.

As shown in FIG. 3, the columnar portion CL includes a core portion 60, a channel 20, and a memory film 24.

The core portion 60 contains, for example, silicon oxide.

The shape of the core portion 60 is, for example, a circular columnar shape.

The channel 20 is provided on a side surface of the core portion 60. The shape of the channel 20 is, for example, a bottomed cylindrical shape. The channel 20 includes a body 20a and a cover layer 20b. The cover layer 20b is provided on a side surface of the body 20a. The body 20a and the cover layer 20b contain silicon, for example, polysilicon formed by crystallization of amorphous silicon. The lower end of the channel 20 (body 20a) is in contact with the conductive film 12.

The memory film 24 includes a tunnel insulating film 21, a charge storage film 22, and a block insulating film 23.

The tunnel insulating film 21 is provided on a side surface of the channel 20. The tunnel insulating film 21 contains, for example, silicon oxide.

The charge storage film 22 is provided on a side surface of the tunnel insulating film 21. The charge storage film 22 contains, for example, silicon nitride (SiN). A memory cell including the charge storage film 22 is formed at a crossing portion between the channel 20 and the electrode film 40 (word line).

The tunnel insulating film 21 is a potential barrier between the charge storage film 22 and the channel 20. In the tunnel insulating film 21, when an electron moves from the channel 20 to the charge storage film 22 (writing operation), and when an electron moves from the charge storage film 22 to the channel 20 (erasing operation), the electric charges tunnel.

The charge storage film 22 has a trap site for trapping an electric charge in the film. A threshold value of the memory cell changes depending on the presence or absence of an electric charge trapped at the trap site, and the amount of the trapped electric charge. In this manner, the memory cell holds information.

The block insulating film 23 is provided on a side surface of the charge storage film 22. For example, the block insulating film 23 is a silicon oxide film containing silicon oxide or an aluminum oxide film containing aluminum oxide (AlO). The block insulating film 23 may be a stacked film of a silicon oxide film and an aluminum oxide film. The block insulating film 23 protects, for example, the charge storage film 22 from etching when forming the electrode film 40.

On an upper side of the columnar portions CL, a plurality of bit lines (not shown) extending in the Y-direction is provided. The upper end of the columnar portion CL is connected to one bit line through a contact.

In an end portion 15t of the stacked body 15, the shape thereof is a stepped shape, and a terrace is formed for each electrode film 40. On the end portion 15t in a stepped shape, an insulating film 43 is provided. For example, the insulating film 43 covers the end portion 15t. The insulating film 43 contains, for example, TEOS (tetraethoxysilane).

A contact 30 is positioned on the terrace of the electrode film 40, and extends in the Z-direction in the insulating film 43. In the contact 30, the lower end thereof is connected to the electrode film 40, and the upper end thereof is connected to an upper layer interconnect (not shown) extending in the X-direction. The contact 30 contains, for example, a conductive material such as tungsten. The number and arrangement of the contacts 30 are arbitrary.

In the peripheral region Rp, a peripheral circuit (not shown) is provided. On the peripheral circuit, a plurality of contacts 31 is provided. In the contact 31, the lower end thereof is connected to the peripheral circuit, and the upper end thereof is connected to, for example, the upper layer interconnect extending in the X-direction. That is, each electrode film 40 is drawn out and connected to the peripheral circuit through the contacts 30 and 31, and the upper layer interconnect. The contact 31 contains, for example, a conductive material such as tungsten. The number and arrangement of the contacts 31 are arbitrary.

In the memory cell region Rm and the peripheral region Rp, a slit ST is provided. The slit ST extends in the X-direction and the Z-direction in the stacked body 15 and the insulating film 43. The slit ST performs division into a plurality of stacked bodies 15 along the Y-direction.

In the slit ST, an insulating film 44 is provided.

In the connection region Rc, a plurality of insulating members 50 is provided. The insulating member 50 contains, for example, silicon oxide. The insulating member 50 may contain silicon nitride. The insulating member 50 includes a first portion 50a and a second portion 50b. The first portion 50a corresponds to an insulating member, and the second portion 50b corresponds to a first member.

In the first portion 50a, a part thereof is positioned in the insulating film 11, and the other part thereof is provided so as to be positioned between the conductive films 12 adjacent to each other in the X-direction. The first portion 50a has, for example, a plate shape, and extends in the Y-direction.

The second portion 50b is provided on the first portion 50a so as to be positioned in the insulating film 43. The second portion 50b has, for example, a circular columnar shape, and extends in the Z-direction.

A width W1 in the X-direction of the first portion 50a is larger than a width W2 in the X-direction of the second portion 50b.

Incidentally, the number and arrangement of the insulating members 50 are arbitrary, and the shapes of the first portion 50a and the second portion 50b are arbitrary. Further, portions (the first portion 50a and the second portion 50b) where the insulating member 50 is provided may be gaps.

In the memory cell region Rm, many memory cells are arranged in a three-dimensional matrix along the X-direction, the Y-direction, and the Z-direction, and data can be stored in each memory cell. In the peripheral region Rp, each electrode film 40 is drawn out from the memory cell region Rm, and is connected to the peripheral circuit through the contacts 30 and 31 and the upper layer interconnect. In the connection region Rc, the conductive films 12 adjacent to each other in the X-direction are insulated from each other by the insulating member 50.

Next, a method for manufacturing the semiconductor memory device according to the first embodiment will be described.

FIG. 4A and FIG. 4B to FIG. 9A and FIG. 9B, and FIG. 11A and FIG. 11B to FIG. 14A and FIG. 14B are views showing the method for manufacturing the semiconductor memory device 1.

Figure 10:
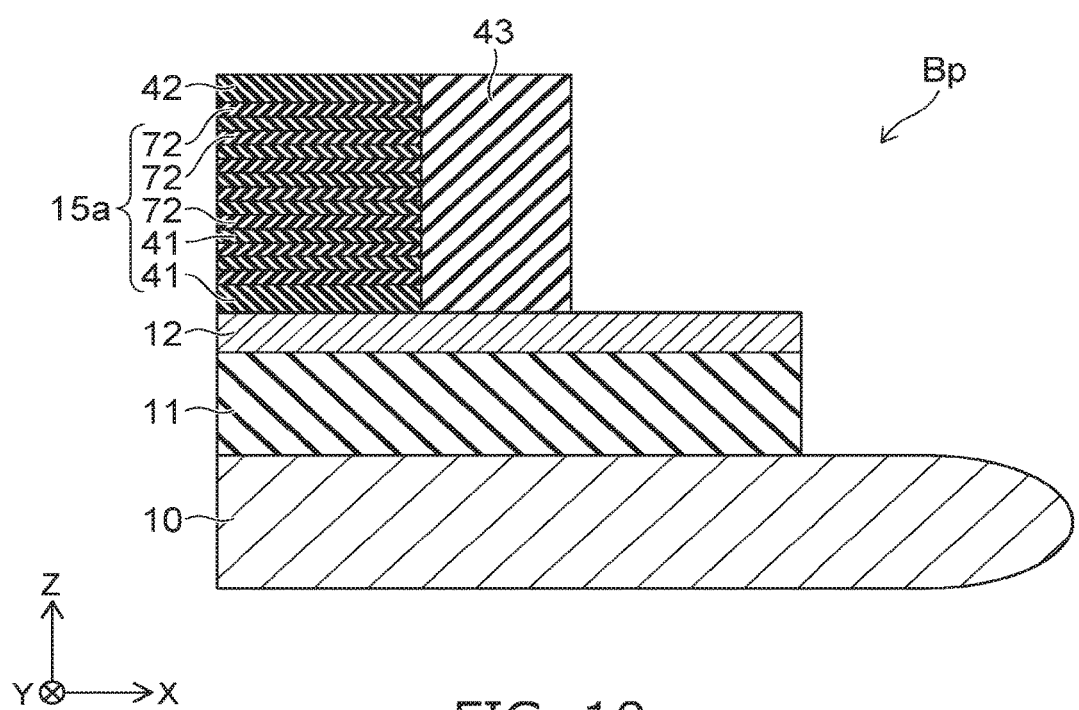
FIG. 10 is a sectional view showing a part of the semiconductor memory device according to the first embodiment.

FIG. 10 is a sectional view showing a part of the semiconductor memory device 1.

FIG. 4A to FIG. 9A, and FIG. 11A to FIG. 14A are plan views and correspond to the region shown in FIG. 1. FIG. 4B to FIG. 9B, and FIG. 11B to FIG. 14B are sectional views and correspond to the region shown in FIG. 2. FIG. 10 is a sectional view of one end in the X-direction of the semiconductor memory device 1, and shows a portion (a bevel portion Bp) in which the substrate 10, the insulating film 11, and the conductive film 12 are exposed.

Figure 4A:
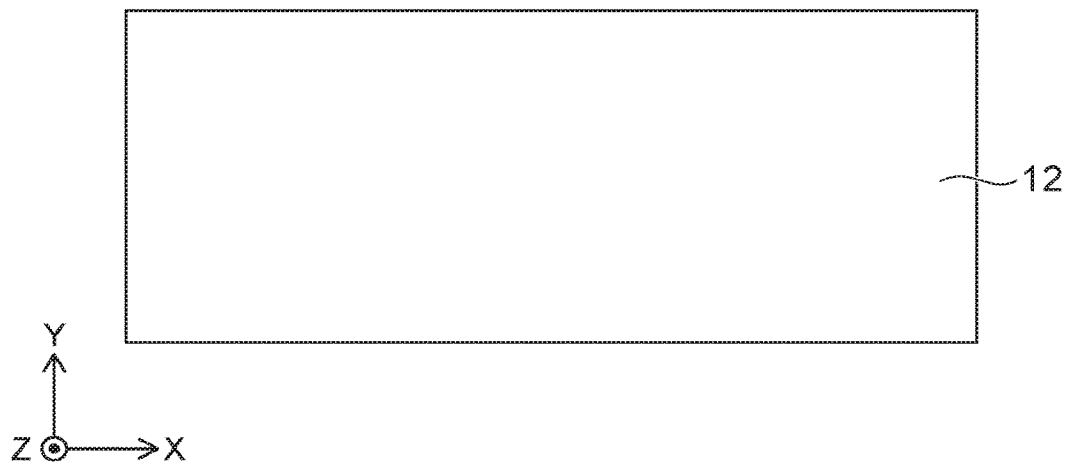
FIG. 4A and FIG. 4B are plan and sectional views showing a method for manufacturing the semiconductor memory device according to the first embodiment.
Figure 4B:
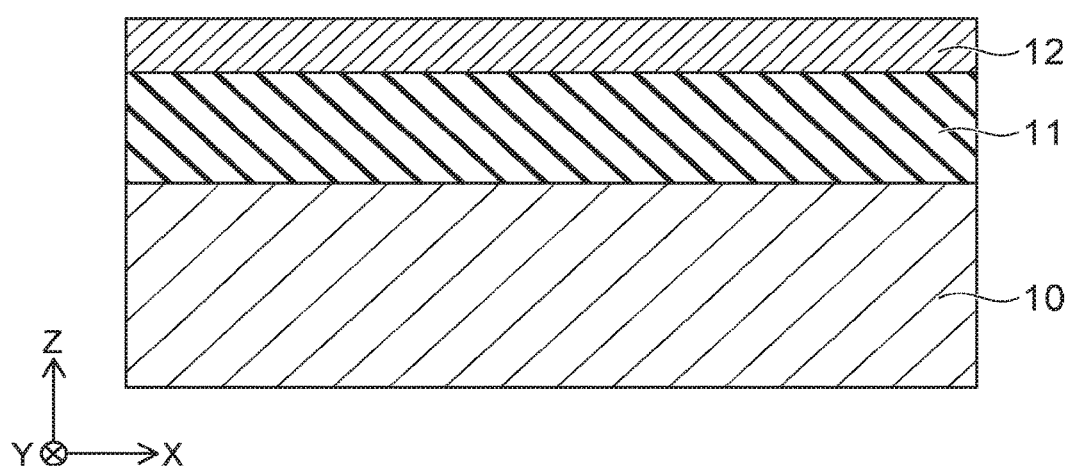

First, as shown in FIG. 4A and FIG. 4B, on a substrate 10 containing silicon, for example, by a CVD (Chemical Vapor Deposition) method, an insulating film 11 and a conductive film 12 are sequentially formed. For example, the insulating film 11 is formed of silicon oxide, and the conductive film 12 is formed of tungsten.

Figure 5A:
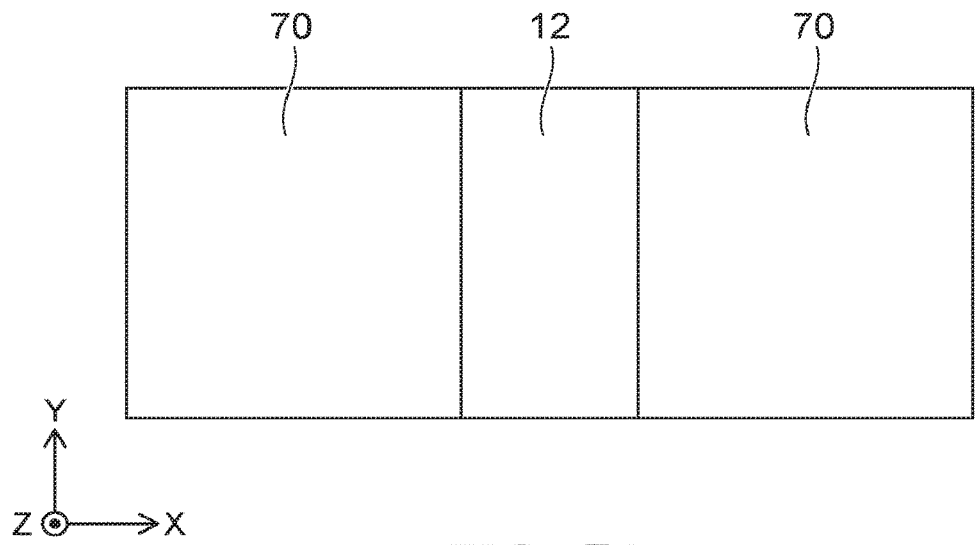
FIG. 5A and FIG. 5B are plan and sectional views showing the method for manufacturing the semiconductor memory device according to the first embodiment.
Figure 5B:
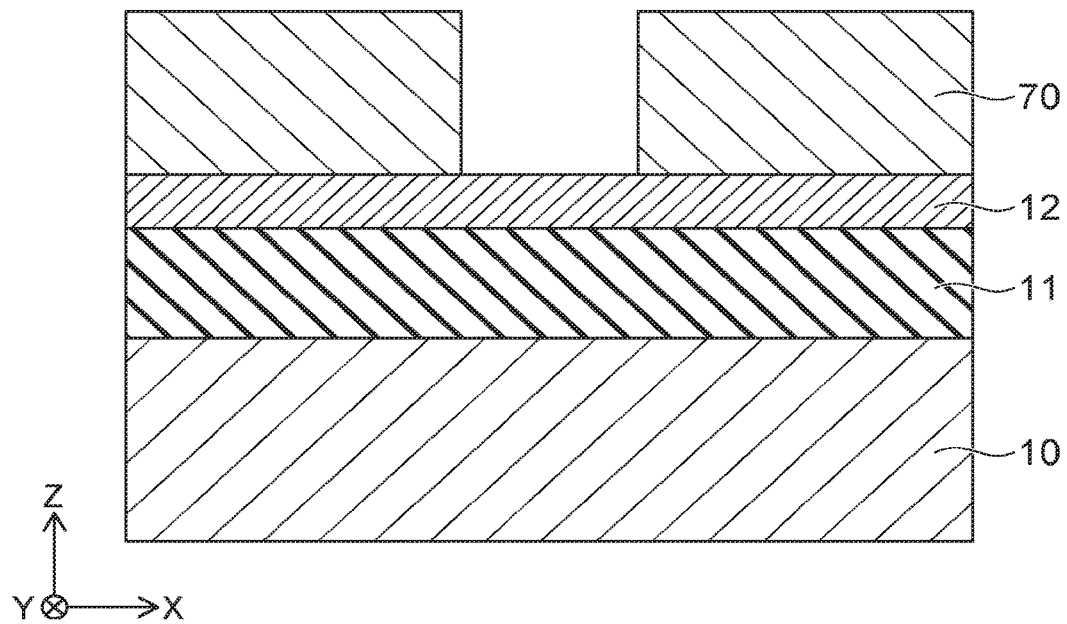

Subsequently, as shown in FIG. 5A and FIG. 5B, a part of a mask 70 is removed by photolithography, whereby a pattern is formed.

Figure 6A:
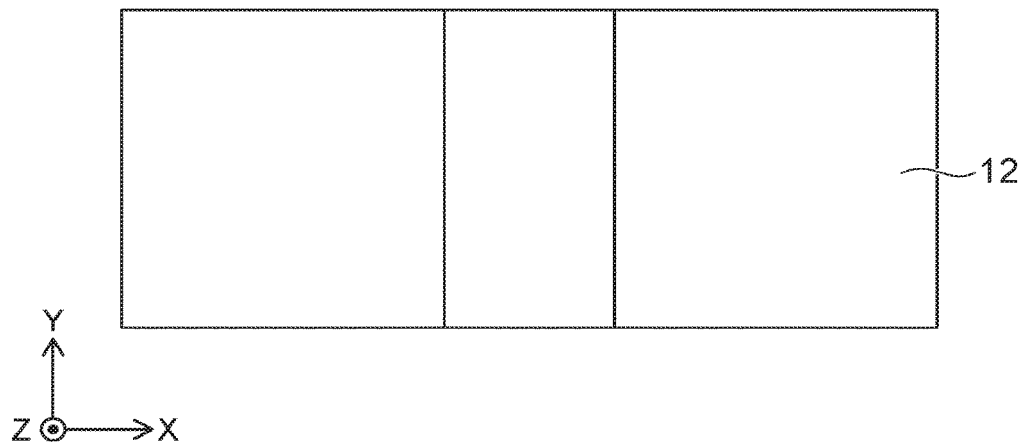
FIG. 6A and FIG. 6B are plan and sectional views showing the method for manufacturing the semiconductor memory device according to the first embodiment.
Figure 6B:
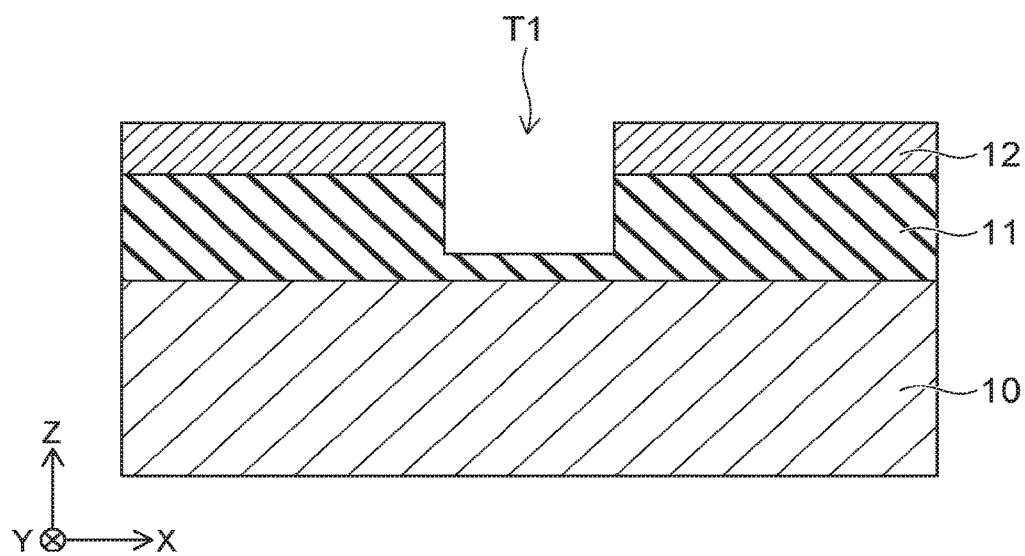

Subsequently, as shown in FIG. 6A and FIG. 6B, a part of the insulating film 11 and a part of the conductive film 12 are removed by an etching treatment such as RIE (Reactive Ion Etching), whereby a trench T1 is formed. The trench T1 has a predetermined width in the X-direction, and extends in the Y-direction. Subsequently, the mask 70 is removed.

Figure 7A:
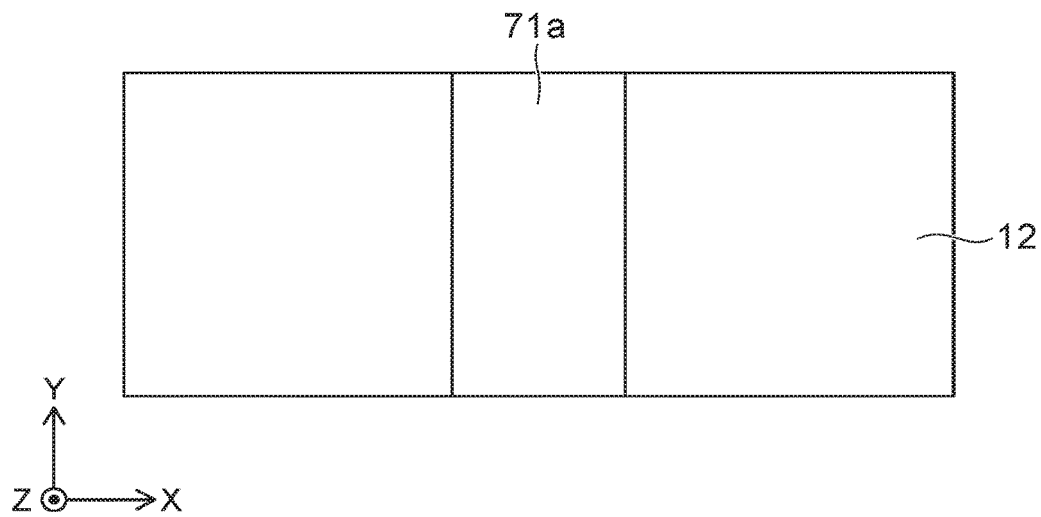
FIG. 7A and FIG. 7B are plan and sectional views showing the method for manufacturing the semiconductor memory device according to the first embodiment.
Figure 7B:
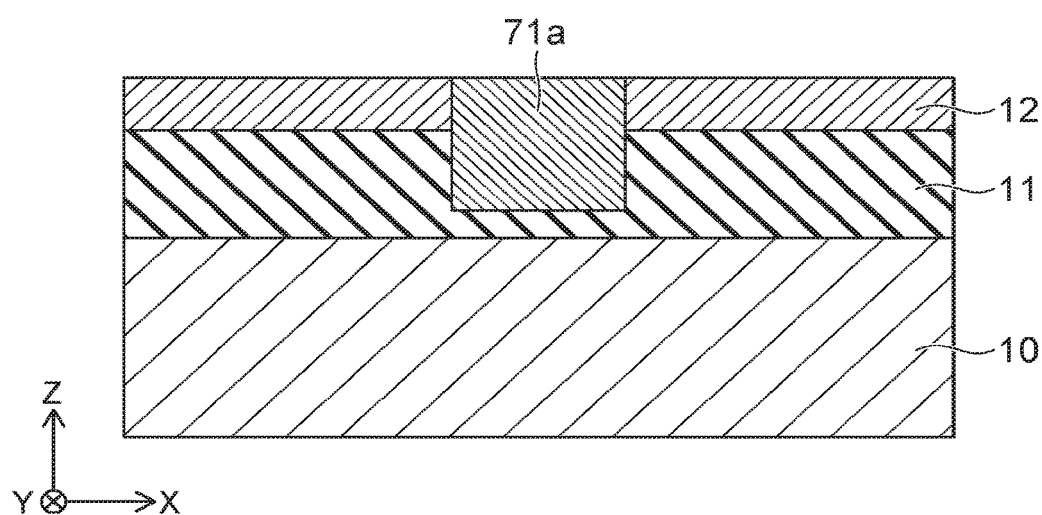

Subsequently, as shown in FIG. 7A and FIG. 7B, a sacrifice film 71a is formed by being buried in the trench T1 by, for example, a CVD method. The sacrifice film 71a is formed of a material which is a conductive material and can have an etching selection ratio with respect to the insulating film 11 and the conductive film 12 in consideration of the removal of the sacrifice film 71a in a later process (the process in FIG. 13). For example, the sacrifice film 71a is formed of polysilicon. The sacrifice film 71a may be formed of conductive carbon. Subsequently, by a CMP (Chemical Mechanical Polishing) method, an upper surface of the conductive film 12 and an upper surface of the sacrifice film 71a are flattened.

Figure 8A:
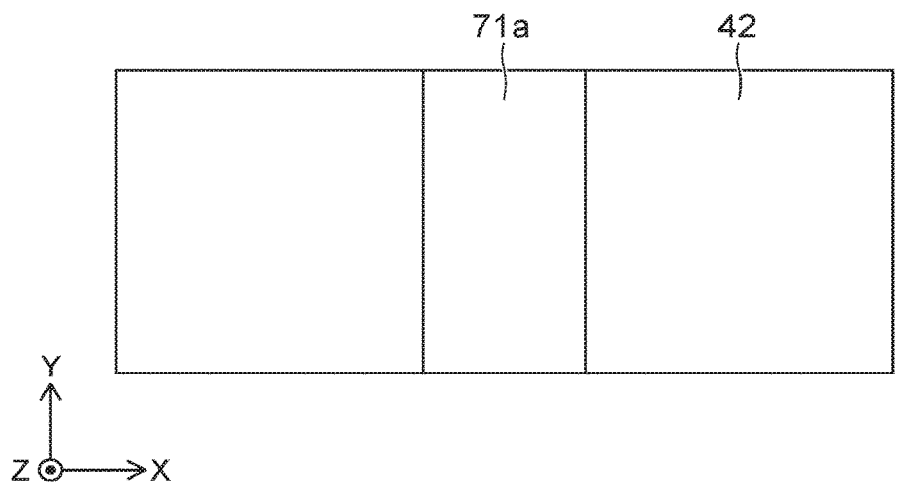
FIG. 8A and FIG. 8B are plan and sectional views showing the method for manufacturing the semiconductor memory device according to the first embodiment.
Figure 8B:
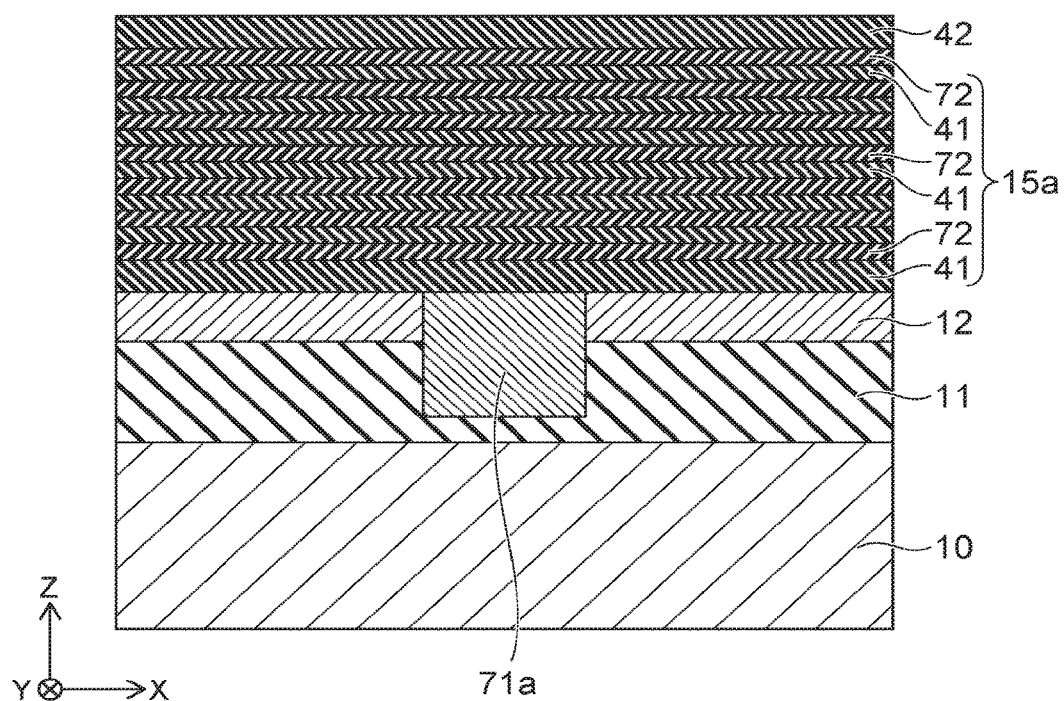

Subsequently, as shown in FIG. 8A and FIG. 8B, on the conductive film 12 and the sacrifice film 71a, an insulating film 41 and a sacrifice film 72 are alternately stacked along the Z-direction, whereby a stacked body 15a is formed. Subsequently, an insulating film 42 is formed on the stacked body 15a. For example, the insulating film 41 is formed of silicon oxide, and the sacrifice film 72 is formed of silicon nitride.

Figure 9A:
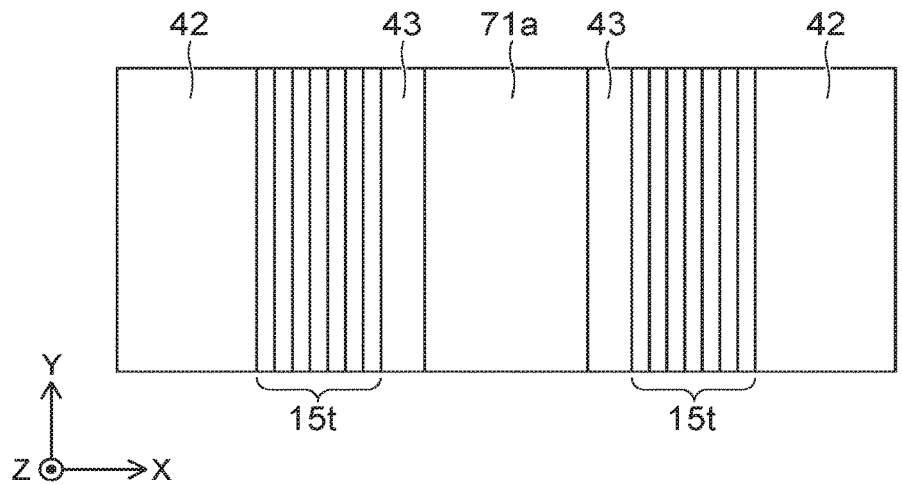
FIG. 9A and FIG. 9B are plan and sectional views showing the method for manufacturing the semiconductor memory device according to the first embodiment.
Figure 9B:
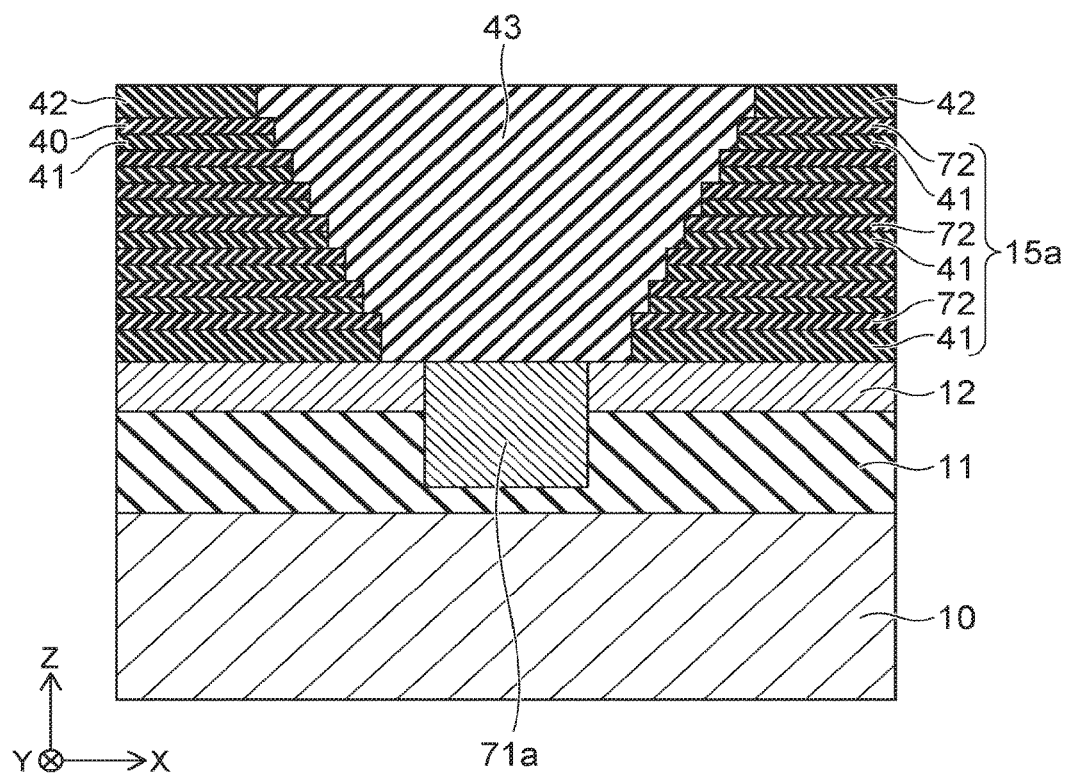

Subsequently, as shown in FIG. 9A and FIG. 9B, formation of a pattern by lithography and an etching treatment such as RIE are performed a plurality of times, whereby an end portion 15t of the stacked body 15a is processed into a stepped shape. Subsequently, on the sacrifice film 71a, and on the end portion 15t of the stacked body 15a, an insulating film 43 is formed, and thereafter, an upper surface of the insulating film 43 is flattened by a CMP method.

Subsequently, as shown in FIG. 10, in one end (the bevel portion Bp) in the X-direction of the semiconductor memory device 1, a part of the insulating film 43 is removed by an etching treatment. The removed insulating film 43 corresponds to a portion covering the substrate 10, the insulating film 11, and the conductive film 12. By doing this, in the bevel portion Bp, the substrate 10, the insulating film 11, and the conductive film 12 are exposed.

Figure 11A:
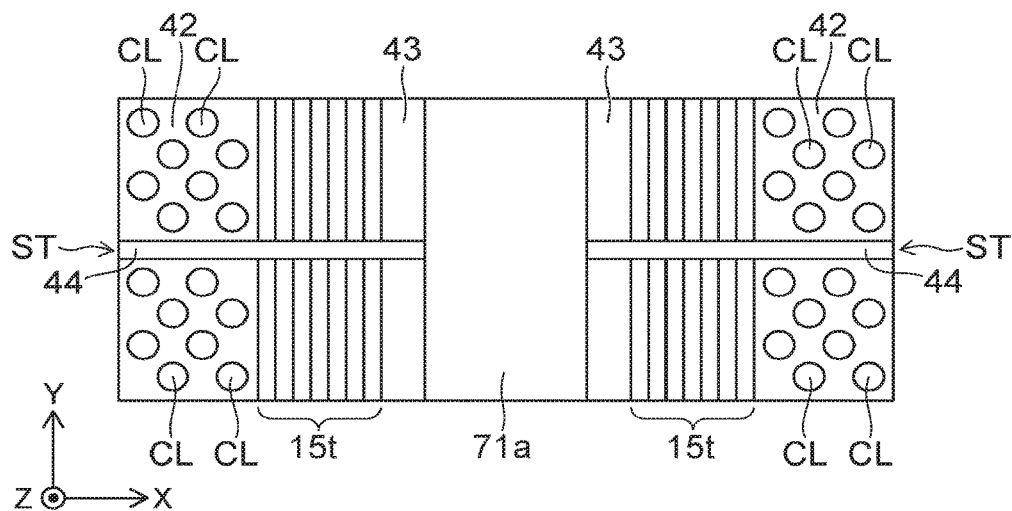
FIG. 11A and FIG. 11B are plan and sectional views showing the method for manufacturing the semiconductor memory device according to the first embodiment.
Figure 11B:
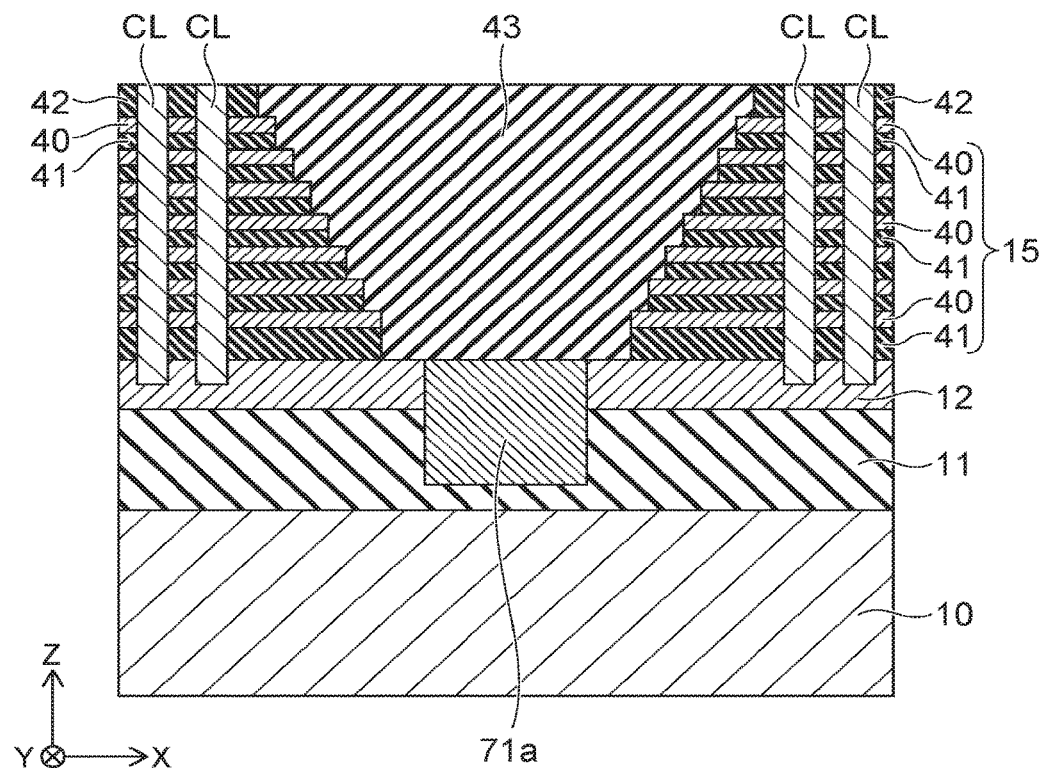

Subsequently, as shown in FIG. 11A and FIG. 11B, a pattern is formed by lithography, and after a plurality of memory holes are formed in the stacked body 15a by an etching treatment such as RIE, in the memory hole, a memory film 24 including a tunnel insulating film 21, a charge storage film 22, and a block insulating film 23, a channel 20, and a core portion 60 are formed (see FIG. 3). By doing this, a columnar portion CL is formed.

Subsequently, a pattern is formed by lithography, and a slit ST is formed in the stacked body 15a and the insulating film by an etching treatment such as RIE. Thereafter, by performing wet etching through the slit ST, the sacrifice film 72 is removed. For example, phosphoric acid is used as an etchant for the wet etching. By removing the sacrifice film 72, a cavity is formed, and a metal such as tungsten is deposited and buried in the cavity through the slit ST. By doing this, an electrode film 40 is formed, and a stacked body 15 including the insulating film 41 and the electrode film 40 is formed. Thereafter, an insulating film 44 is formed in the slit ST.

Figure 12A:
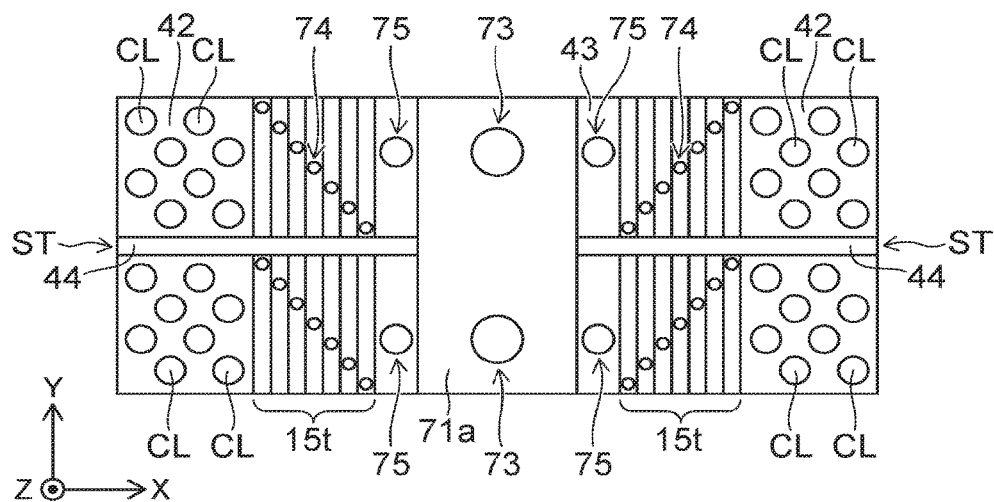
FIG. 12A and FIG. 12B are plan and sectional views showing the method for manufacturing the semiconductor memory device according to the first embodiment.
Figure 12B:
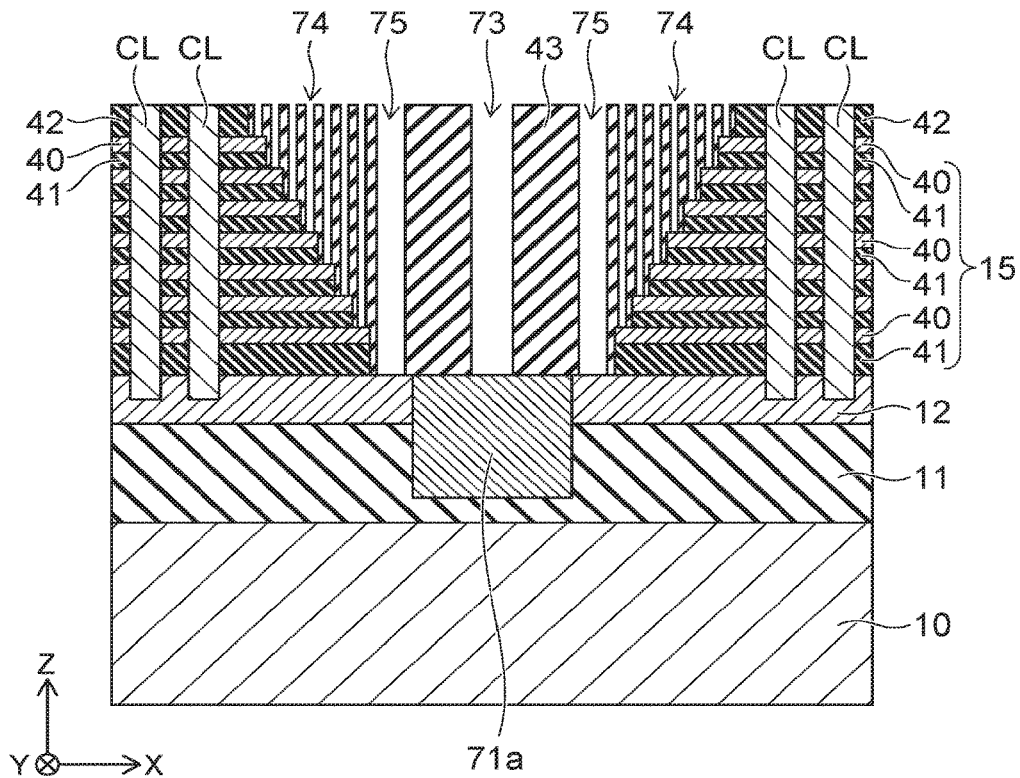

Subsequently, as shown in FIG. 12A and FIG. 12B, a pattern is formed by lithography, and a plurality of holes 73 opening to the sacrifice film 71a is formed. Incidentally, a groove may be formed in place of the hole 73. Further, when forming the hole 73, contact holes 74 and 75 are formed.

Figure 13A:
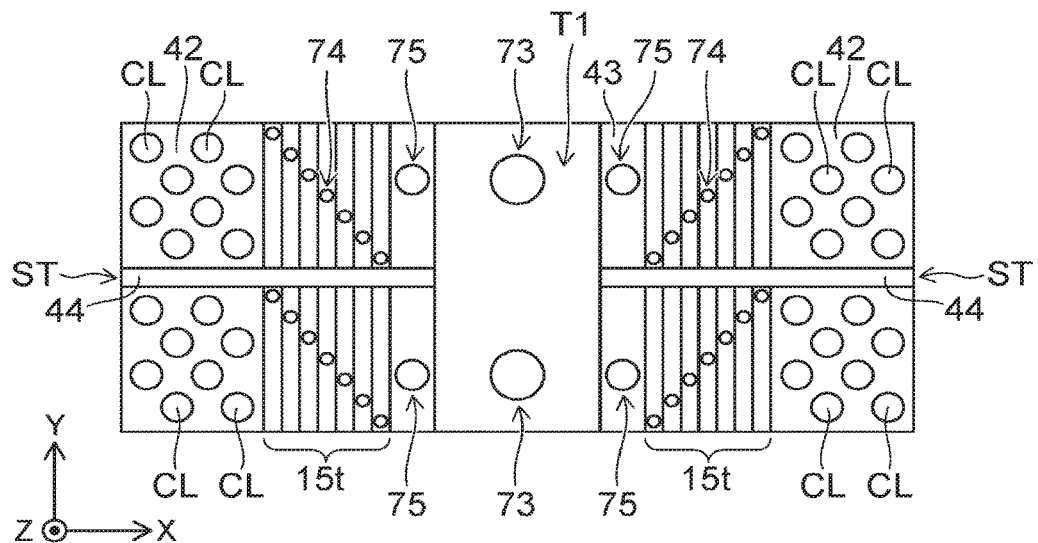
FIG. 13A and FIG. 13B are plan and sectional views showing the method for manufacturing the semiconductor memory device according to the first embodiment.
Figure 13B:
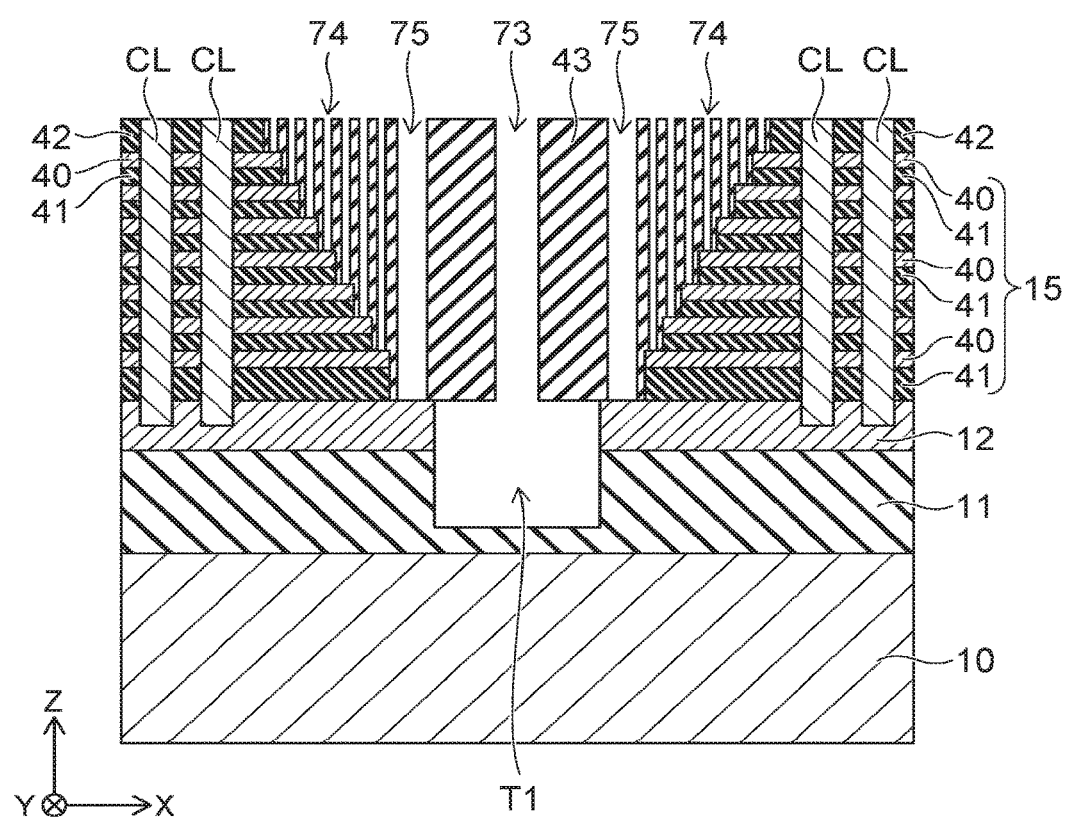

Subsequently, as shown in FIG. 13A and FIG. 13B, the sacrifice film 71a is removed by a chemical liquid treatment capable of obtaining an etching selection ratio with respect to the insulating film 11 and the conductive film 12, for example, TMY, whereby the conductive film 12 extending in the X-direction is divided. By removing the sacrifice film 71a, a trench T1 is formed.

Figure 14A:
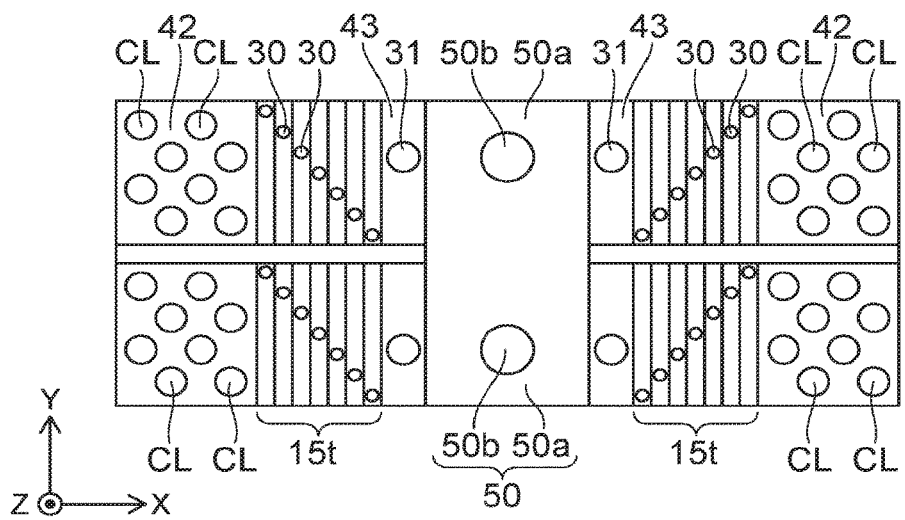
FIG. 14A and FIG. 14B are plan and sectional views showing the method for manufacturing the semiconductor memory device according to the first embodiment.
Figure 14B:
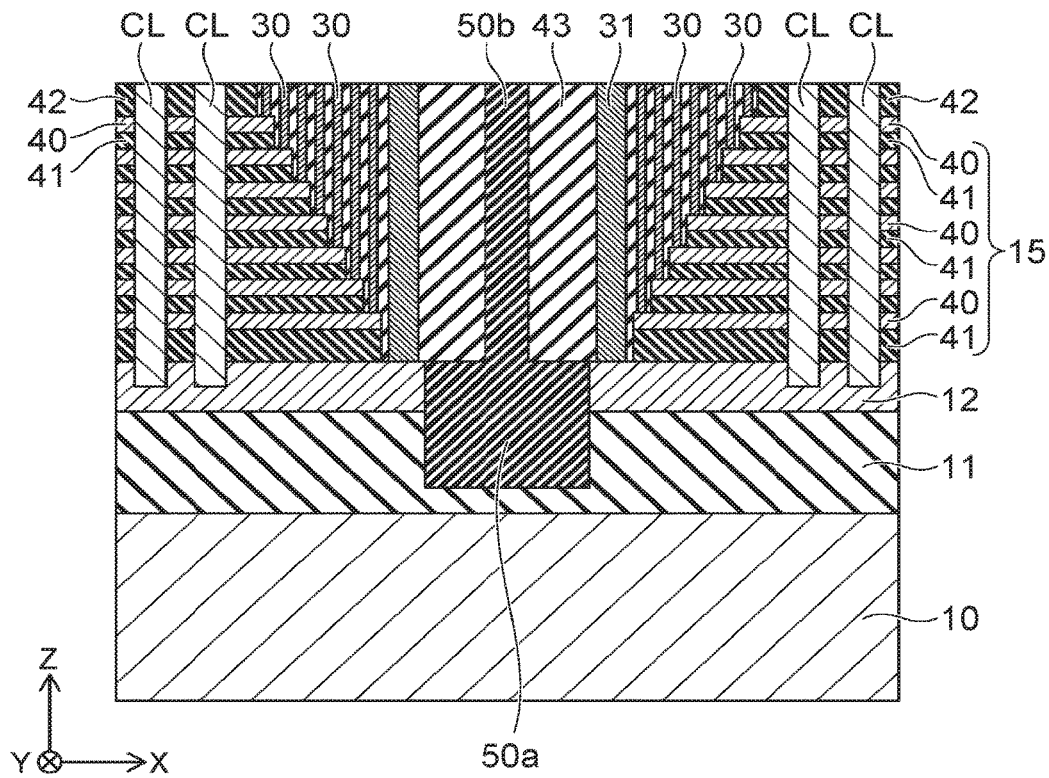

Subsequently, as shown in FIG. 14A and FIG. 14B, silicon oxide or the like is buried in the trench T1 and the hole 73 by, for example, a CVD method, whereby an insulating member 50 is formed. By doing this, the conductive films 12 adjacent to each other in the X-direction are insulated from each other by the insulating member 50. In the insulating member 50, a portion buried in the trench T1 corresponds to a first portion 50a, and a portion buried in the hole 73 corresponds to a second portion 50b. Incidentally, it is not necessary to bury silicon oxide or the like in the trench T1 and the hole 73, and in this case, as shown in FIG. 13A and FIG. 13B, a gap is formed in the insulating film 43.

Subsequently, tungsten or the like is buried in each of the contact holes 74 and 75, whereby contacts 30 and 31 are formed.

In this manner, the semiconductor memory device 1 is manufactured.

Next, effects of the embodiment will be described.

Figure 15A:
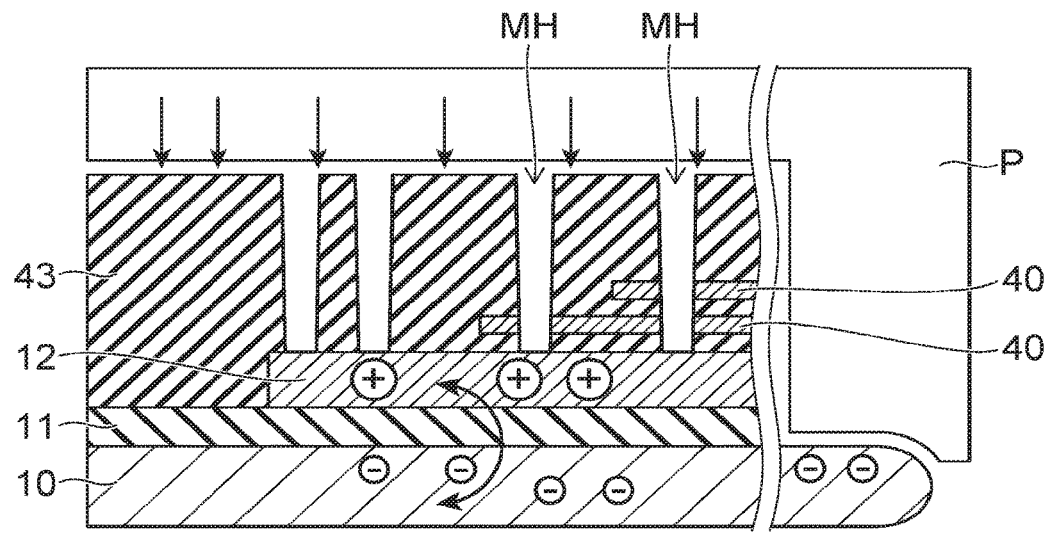
FIG. 15A and FIG. 15B are views illustrating an electric discharge to the substrate.
Figure 15B:
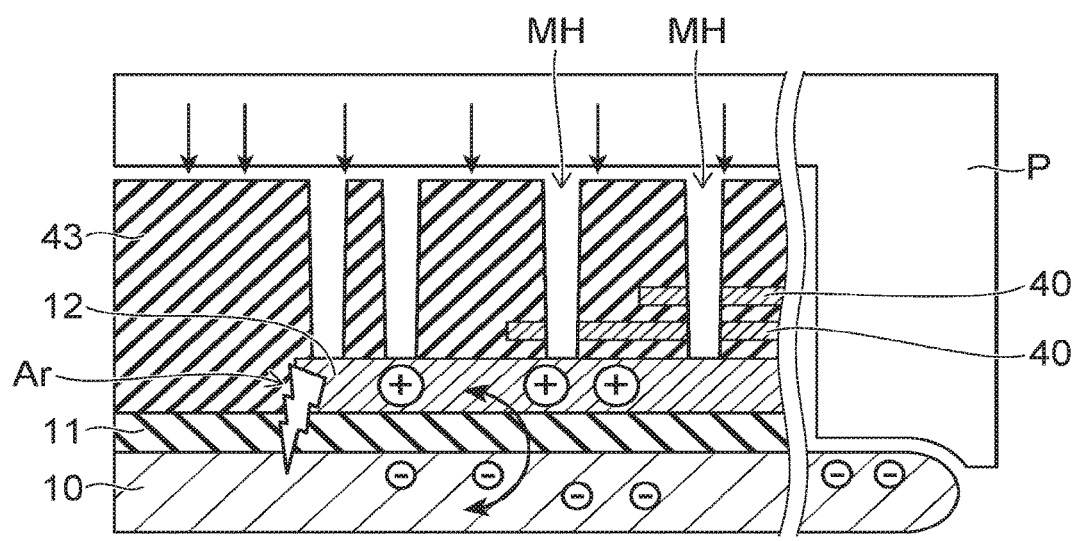

FIG. 15A and FIG. 15B are views illustrating an electric discharge to the substrate.

As shown in FIG. 15A and FIG. 15B, in the semiconductor memory device having a three-dimensional structure, in the case where the conductive film 12 floated from the substrate 10 is not exposed to plasma P in the bevel portion Bp, a positive electric charge is likely to be stored in the conductive film 12 located directly under the structure due to a shading effect in, for example, processing of a memory hole MH using anisotropic etching such as RIE and in processing of a high-density and high-aspect structure. Due to this, the device had a problem that a potential difference occurs between the substrate 10 and the conductive film 12, and thus, the insulating film 11 provided between the substrate 10 and the conductive film 12 undergoes electrical breakdown to generate discharge Ar (arcing).

In the semiconductor memory device 1 of the embodiment, the insulating member 50 including the first portion 50a and the second portion 50b is provided in the connection region Rc. Further, the width W1 in the X-direction of the first portion 50a is larger than the width W2 in the X-direction of the second portion 50b.

Further, in the embodiment, as in the process shown in FIG. 10, FIG. 11A, and FIG. 11B, the conductive film 12 is electrically connected to the bevel portion Bp by the sacrifice film 71a, and a wide area is exposed to plasma in the bevel portion Bp so as to make the potential of the conductive film 12 equal to that of the substrate 10, and thus, the electrical breakdown of the insulating film 11 is suppressed, and the generation of discharge Ar is suppressed.

Also in the case where the members are not exposed in the bevel portion Bp, an opening portion having a large area, for example, an opening portion having an area of 500 nm×500 nm or more and an aspect ratio of 8 or less may be provided in a part of the conductive film 12. According to this, the same effect as described above can be obtained.

Further, in the embodiment, as in the process shown in FIG. 13A and FIG. 13B, after conduction is made by the conductive film 12 and the sacrifice film 71a formed of different conductive materials, division processing is performed by a chemical liquid treatment with high selectivity, division processing of the conductive film 12 on the bottom having a high-aspect structure can be performed simply through the hole 73 having a small volume.

Next, a variation of the embodiment will be described.

Figure 16:
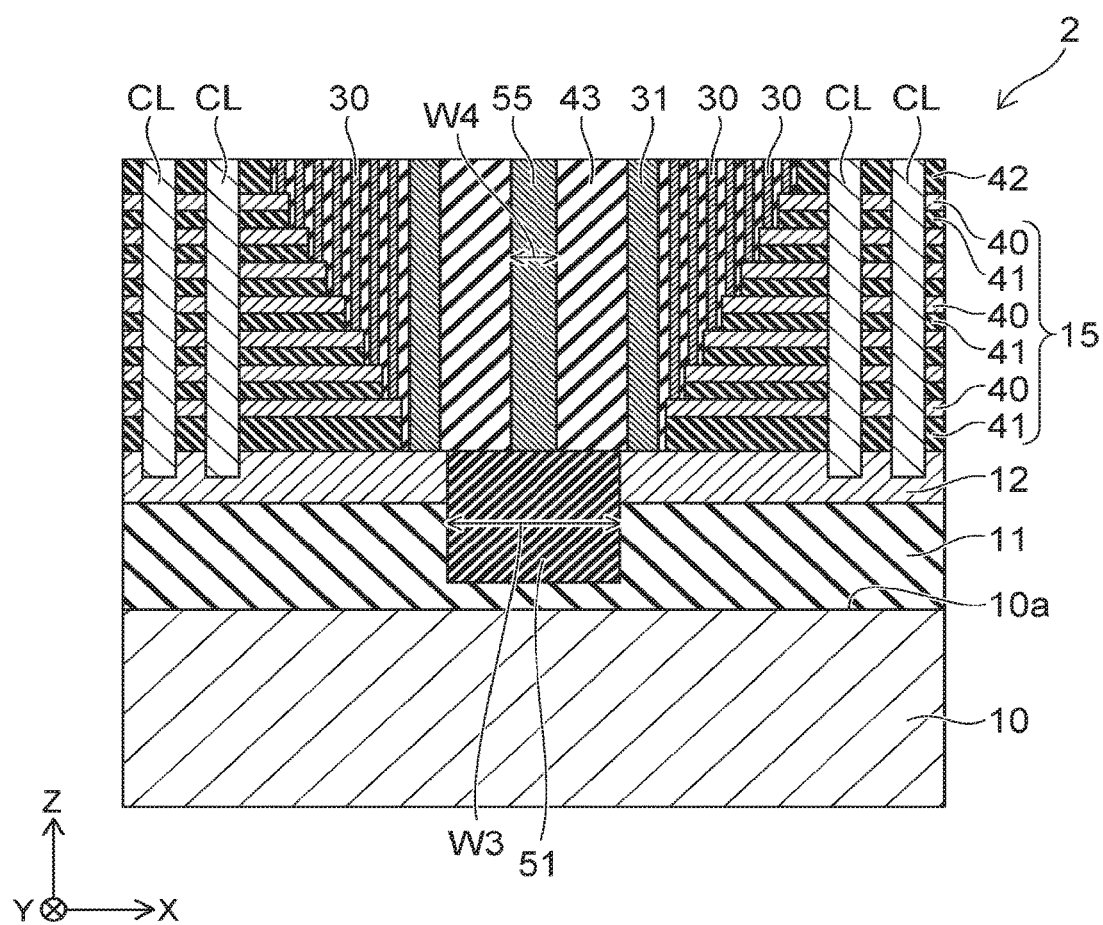
FIG. 16 is a sectional view showing a semiconductor memory device according to a variation of the first embodiment.

FIG. 16 is a sectional view showing a semiconductor memory device 2. A region shown in FIG. 16 corresponds to the region shown in FIG. 2.

As shown in FIG. 16, the semiconductor memory device 2 according to the variation is different in that an insulating member 51 and a conductive member 55 are provided in place of the insulating member 50 in comparison with the semiconductor memory device 1 according to the first embodiment.

In the connection region Rc, the insulating member 51 and the conductive member 55 are provided.

The insulating member 51 is provided such that a part thereof is positioned in the insulating film 11 and the other part thereof is positioned between the conductive films 12 adjacent to each other in the X-direction. The insulating member 51 contains, for example, silicon oxide or silicon nitride.

The conductive member 55 is provided on the insulating member 51 so as to be positioned in the insulating film 43. The conductive member 55 contains, for example, a metal such as tungsten.

A width W3 in the X-direction of the insulating member 51 is larger than a width W4 in the X-direction of the conductive member 55.

Incidentally, with respect to the insulating member 51 and the conductive member 55, the number, shape, and arrangement are arbitrary. Further, a portion where the insulating member 51 is provided may be a gap. A portion where the conductive member 55 is provided may be a gap. That is, at least one of the portion where the insulating member 51 is provided and the portion where the conductive member 55 is provided may be a gap.

The effects of the variation are the same as those of the first embodiment.

(Second Embodiment)

Figure 17:
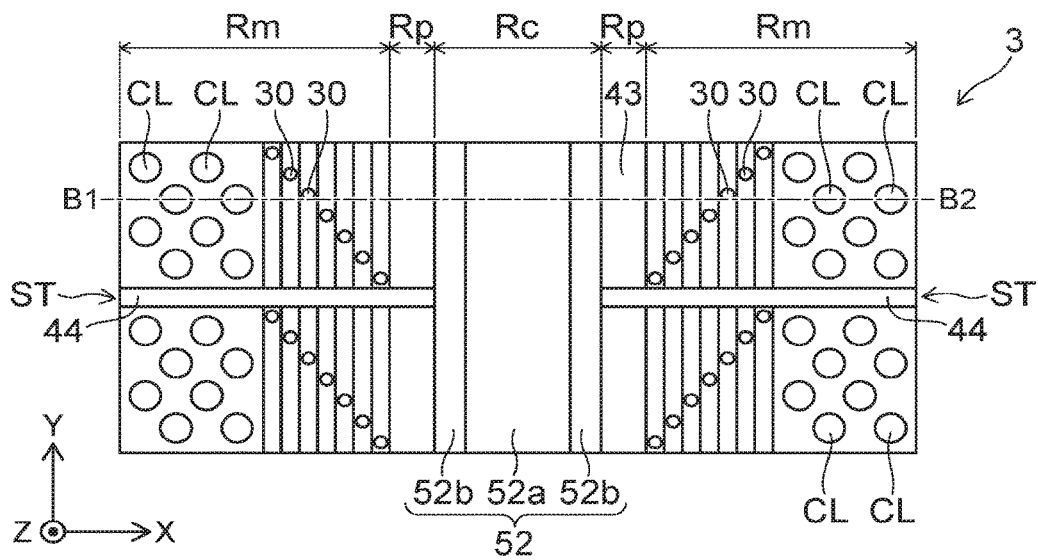
FIG. 17 is a plan view showing a semiconductor memory device according to a second embodiment.

FIG. 17 is a plan view showing a semiconductor memory device 3.

Figure 18:
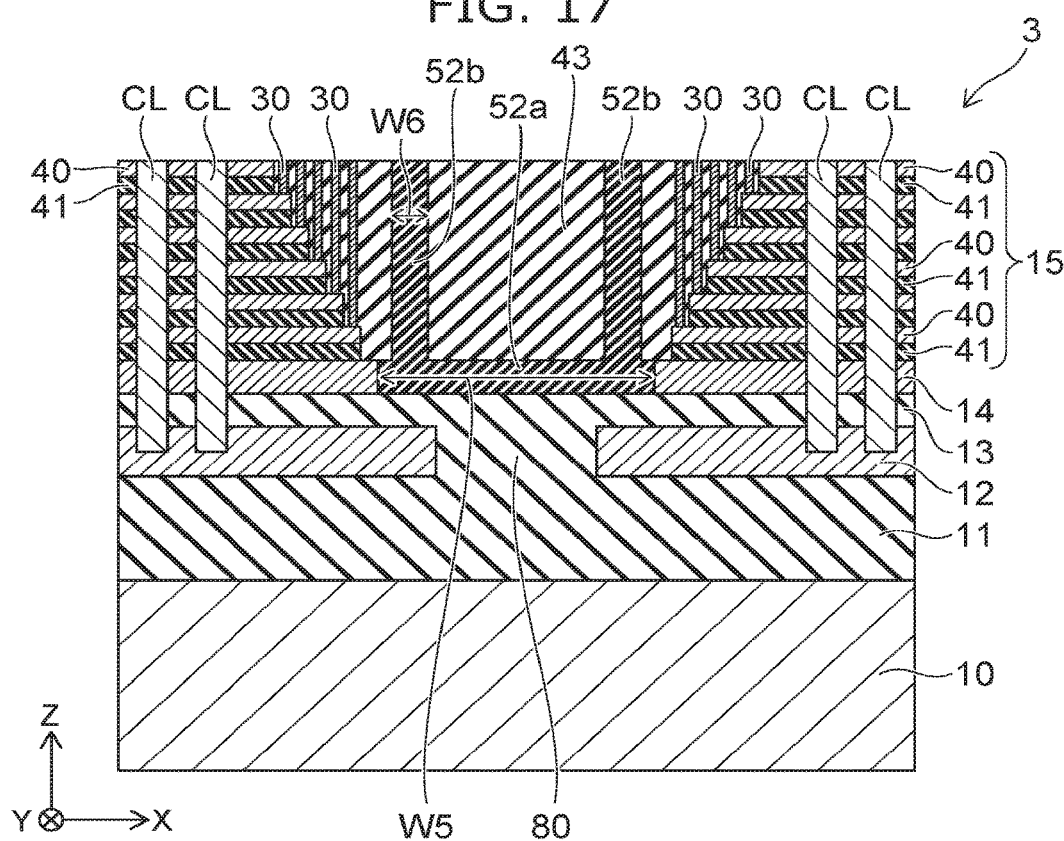
FIG. 18 is a sectional view taken along a line B1-B2 of FIG. 17.

FIG. 18 is a sectional view taken along a line B1-B2 of FIG. 17.

Regions shown in FIG. 17 and FIG. 18 correspond to the regions shown in FIG. 1 and FIG. 2, respectively.

As shown in FIG. 17 and FIG. 18, the semiconductor memory device 3 according to the embodiment is different in that an interlayer insulating film 80, an insulating film 13, a conductive film 14, and an insulating member 52 are provided in place of the insulating member 50 in comparison with the semiconductor memory device 1 according to the first embodiment. Incidentally, in FIG. 17 and FIG. 18, illustration of the insulating film 42 of the memory cell region Rm and the contact 31 of the peripheral region Rp is omitted.

In a memory cell region Rm, an insulating film 11, an interlayer insulating film 80, a conductive film 12, an insulating film 13, a conductive film 14, a stacked body 15, and a plurality of columnar portions CL are provided.

The interlayer insulating film 80 is positioned in the conductive film 12, and insulates the conductive films 12 adjacent to each other in the X-direction from each other. The interlayer insulating film 80 contains, for example, silicon oxide.

The insulating film 13 is provided on the interlayer insulating film 80 and the conductive film 12. The insulation resistance of the insulating film 13 is decreased by using a material having a low insulation breakdown voltage or decreasing the film thickness. For example, the insulating film 13 is an oxide film having a width in the Z-direction of 30 nm or less.

A plurality of conductive films 14 is provided on the insulating film 13. The conductive film 14 contains, for example, a metal such as tungsten. The conductive film 14 functions as a source-side select gate.

The stacked body 15 is provided on the conductive film 14.

In a connection region Rc, an insulating member 52 is provided. The insulating member 52 contains, for example, silicon oxide or silicon nitride. The insulating member 52 includes a first portion 52a and a second portion 52b.

The first portion 52a is positioned between the conductive films 14 adjacent to each other in the X-direction. The first portion 52a has, for example, a plate shape, and extends in the Y-direction.

The second portion 52b is provided on the first portion 52a, and is positioned in an insulating film 43. The second portion 52b has, for example, a plate shape, and extends in the Y-direction and the Z-direction.

A width W5 in the X-direction of the first portion 52a is larger than a width W6 in the X-direction of the second portion 52b.

Incidentally, in the insulating member 52, the shapes of the first portion 52a and the second portion 52b are arbitrary. Further, a portion where the insulating member 52 is provided may be a gap. Further, as shown in FIG. 16, in a portion where the insulating member 52 is provided, a part may be formed of a conductor.

Next, a method for manufacturing the semiconductor memory device according to the second embodiment will be described.

FIG. 19A and FIG. 19B to FIG. 25A and FIG. 25B are views showing the method for manufacturing the semiconductor memory device 3.

FIG. 19A to FIG. 25A are plan views and correspond to the region shown in FIG. 17, and FIG. 19B to FIG. 25B are sectional views and correspond to the region shown in FIG. 18.

Incidentally, with respect to the processes shown in FIG. 4A and FIG. 4B to FIG. 6A and FIG. 6B, the first embodiment and the second embodiment are the same, and therefore, illustration and a detailed description are omitted.

Figure 19A:
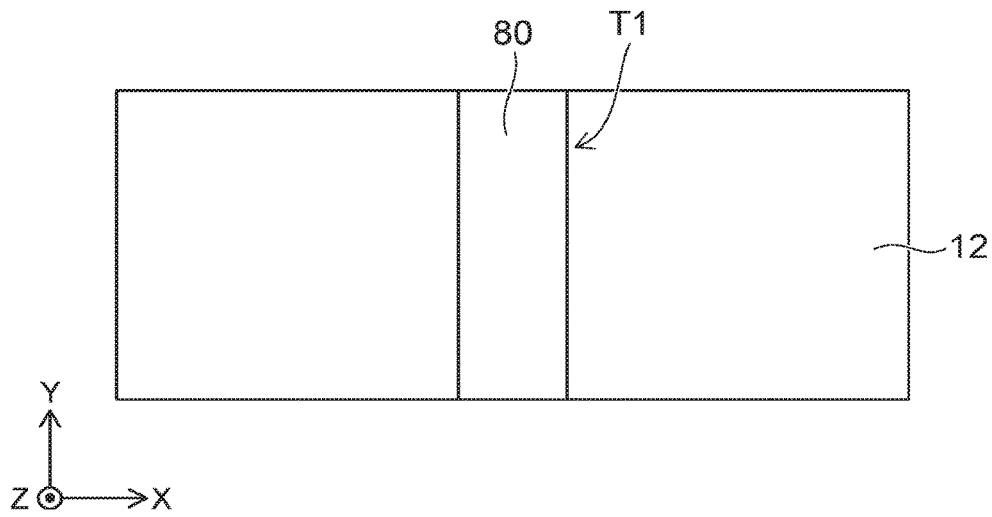
FIG. 19A and FIG. 19B are plan and sectional views showing a method for manufacturing the semiconductor memory device according to the second embodiment.
Figure 19B:
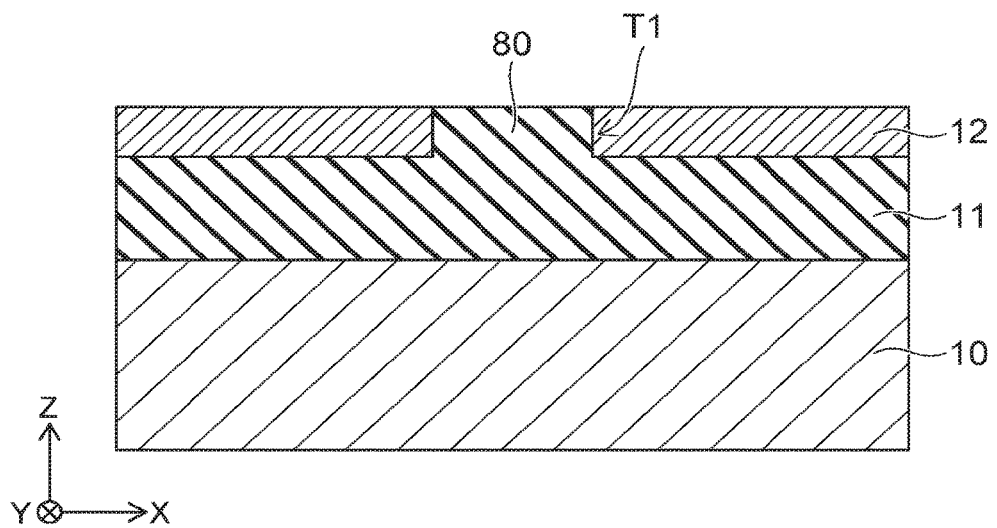

After the process shown in FIG. 6A and FIG. 6B, as shown in FIG. 19A and FIG. 19B, an interlayer insulating film 80 is formed by being buried in a trench T1. Subsequently, an upper surface of a conductive film 12 and an upper surface of the interlayer insulating film 80 are flattened.

Figure 20A:
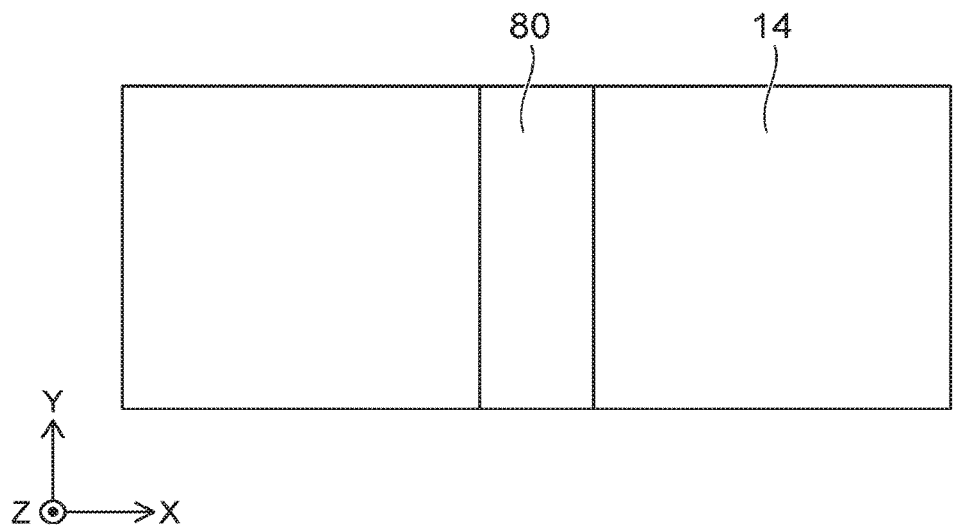
FIG. 20A and FIG. 20B are plan and sectional views showing the method for manufacturing the semiconductor memory device according to the second embodiment.
Figure 20B:
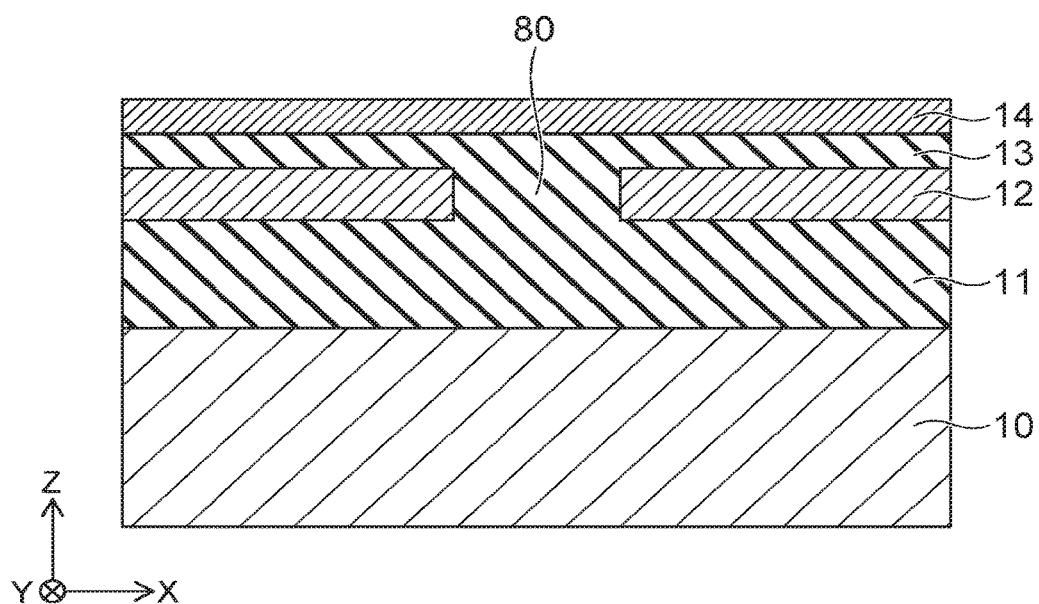

Subsequently, as shown in FIG. 20A and FIG. 20B, on the interlayer insulating film 80 and the conductive film 12, an insulating film 13 is formed. Subsequently, on the insulating film 13, a conductive film 14 is formed.

Figure 21A:
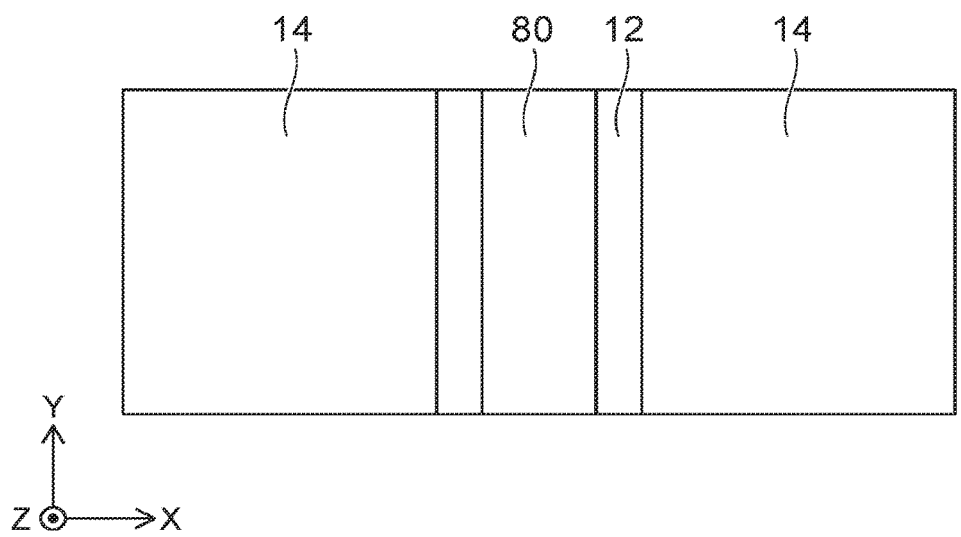
FIG. 21A and FIG. 21B are plan and sectional views showing the method for manufacturing the semiconductor memory device according to the second embodiment.
Figure 21B:
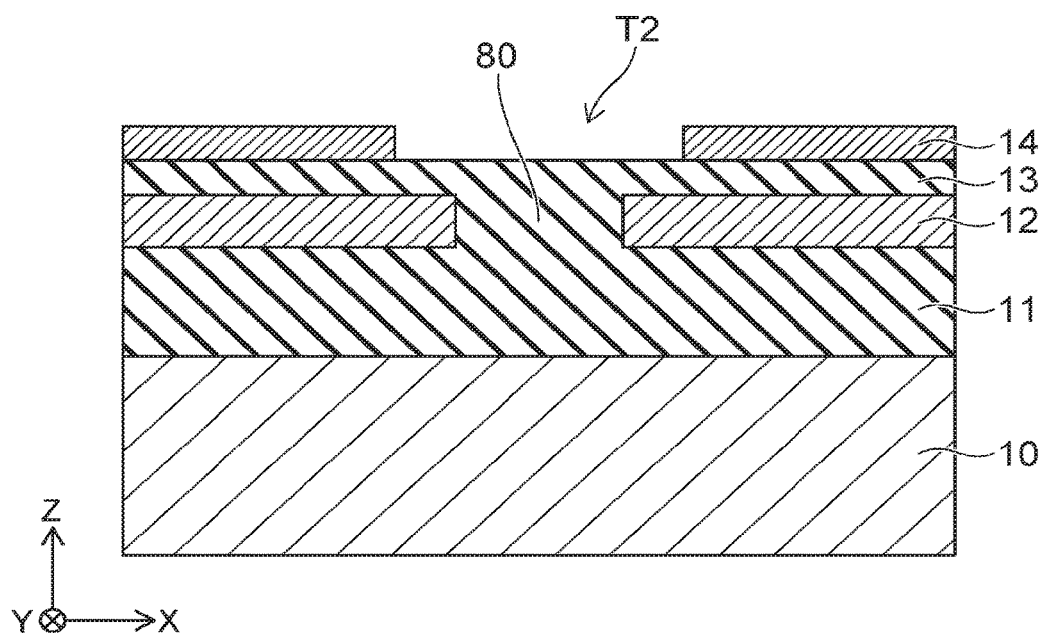

Subsequently, as shown in FIG. 21A and FIG. 21B, a pattern is formed by lithography, and a part of the conductive film 14 is removed by an etching treatment such as RIE, whereby a trench T2 is formed. The trench T2 has a predetermined width in the X-direction and extends in the Y-direction. Subsequently, a mask 70 is removed.

Figure 22A:
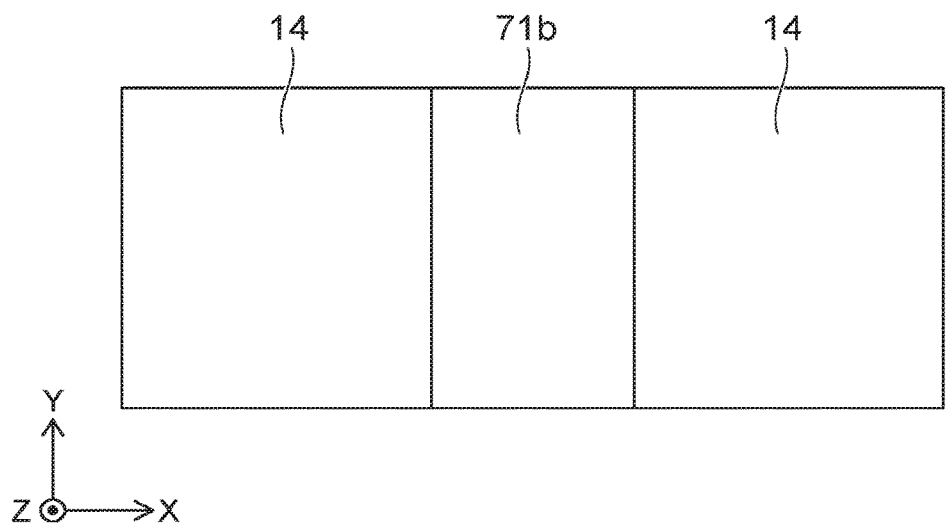
FIG. 22A and FIG. 22B are plan and sectional views showing the method for manufacturing the semiconductor memory device according to the second embodiment.
Figure 22B:
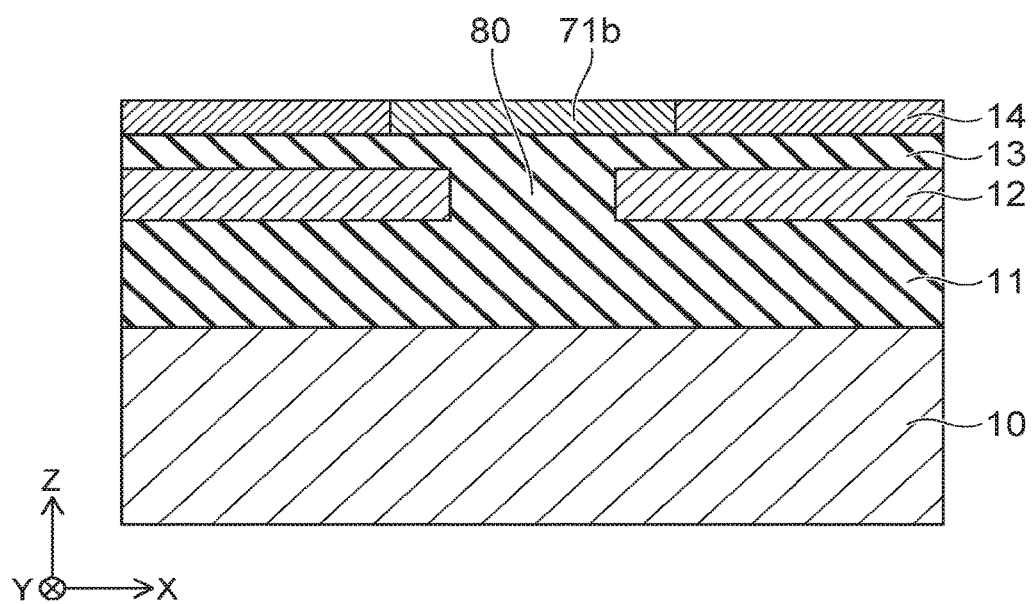

Subsequently, as shown in FIG. 22A and FIG. 22B, a sacrifice film 71b is formed by being buried in the trench T2 by, for example, a CVD method. The sacrifice film 71b is a conductive material, and is formed of, for example, tungsten or molybdenum (Mo). Subsequently, by a CMP method, an upper surface of the conductive film 14 and an upper surface of the sacrifice film 71b are flattened.

Figure 23A:
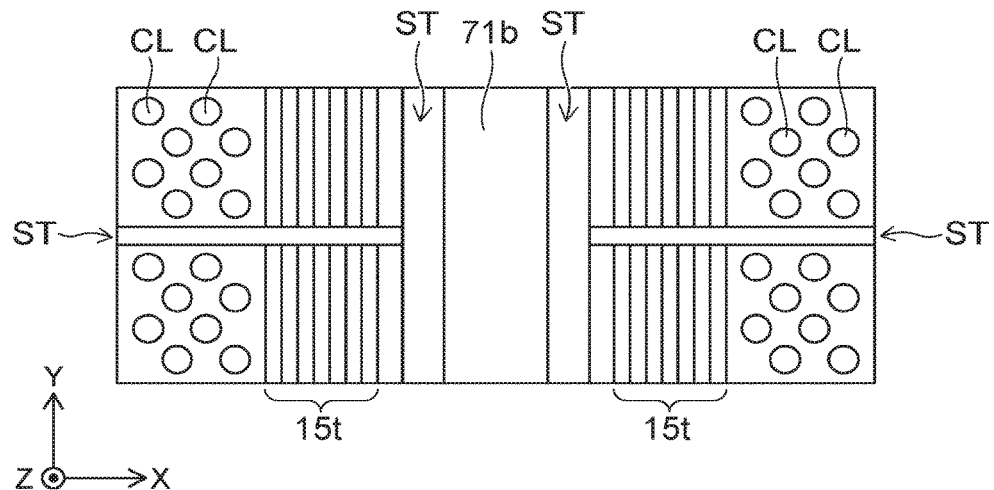
FIG. 23A and FIG. 23B are plan and sectional views showing the method for manufacturing the semiconductor memory device according to the second embodiment.
Figure 23B:
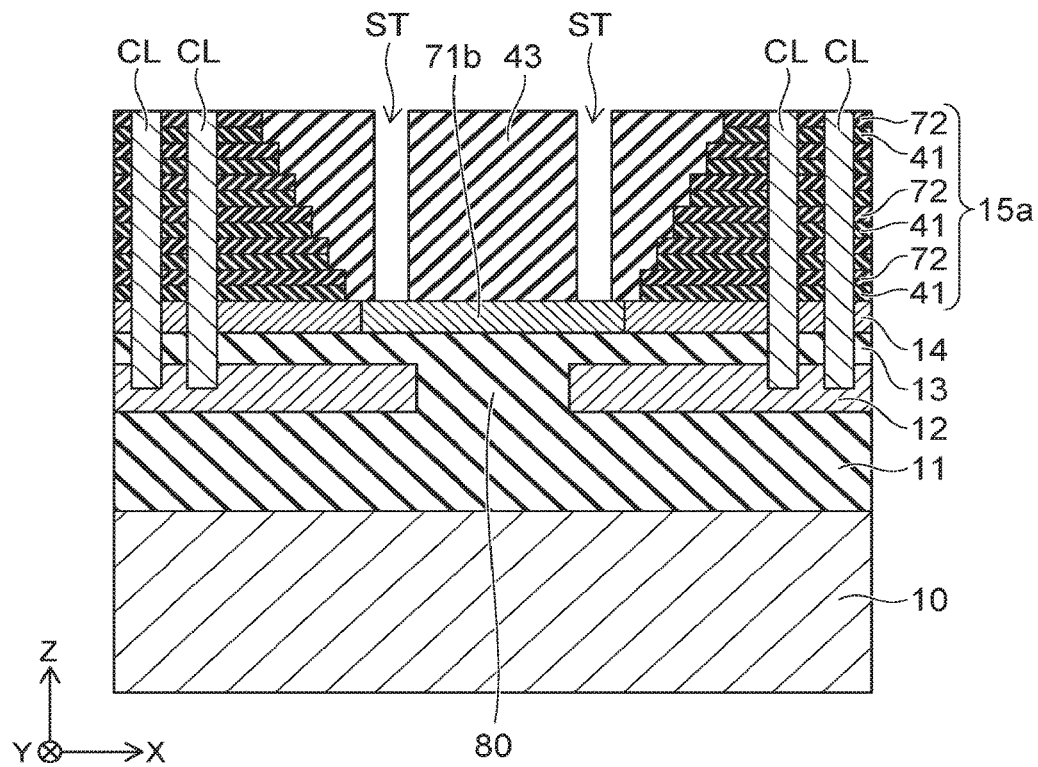

Subsequently, as shown in FIG. 23A and FIG. 23B, on the conductive film 14, an insulating film 41 and a sacrifice film 72 are alternately stacked along the Z-direction, whereby a stacked body 15a is formed. Subsequently, an end portion 15t of the stacked body 15a is processed into a stepped shape, and on the sacrifice film 71b and on the end portion 15t of the stacked body 15a, an insulating film 43 is formed, and then, an upper surface of the insulating film 43 is flattened.

Subsequently, in one end (a bevel portion Bp) in the X-direction of the semiconductor memory device 3, a part of the insulating film 43 is removed by an etching treatment. By doing this, in the bevel portion Bp, the substrate 10, the insulating film 11, and the conductive film 12 are exposed (see FIG. 10).

Subsequently, after a plurality of memory holes are formed in the stacked body 15a, in the memory hole, a memory film 24 including a tunnel insulating film 21, a charge storage film 22, and a block insulating film 23, a channel 20, and a core portion 60 are formed. By doing this, a columnar portion CL is formed. Thereafter, in the stacked body 15a and the insulating film 43, slits ST extending in the X-direction and the Y-direction are formed. The slit ST extending in the Y-direction is formed in contact with the sacrifice film 71b extending in the Y-direction.

Figure 24A:
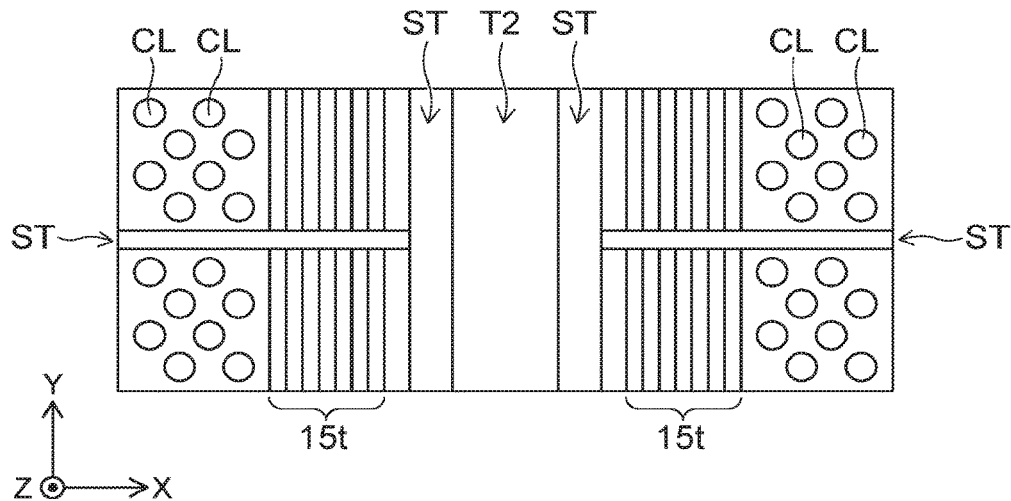
FIG. 24A and FIG. 24B are plan and sectional views showing the method for manufacturing the semiconductor memory device according to the second embodiment.
Figure 24B:
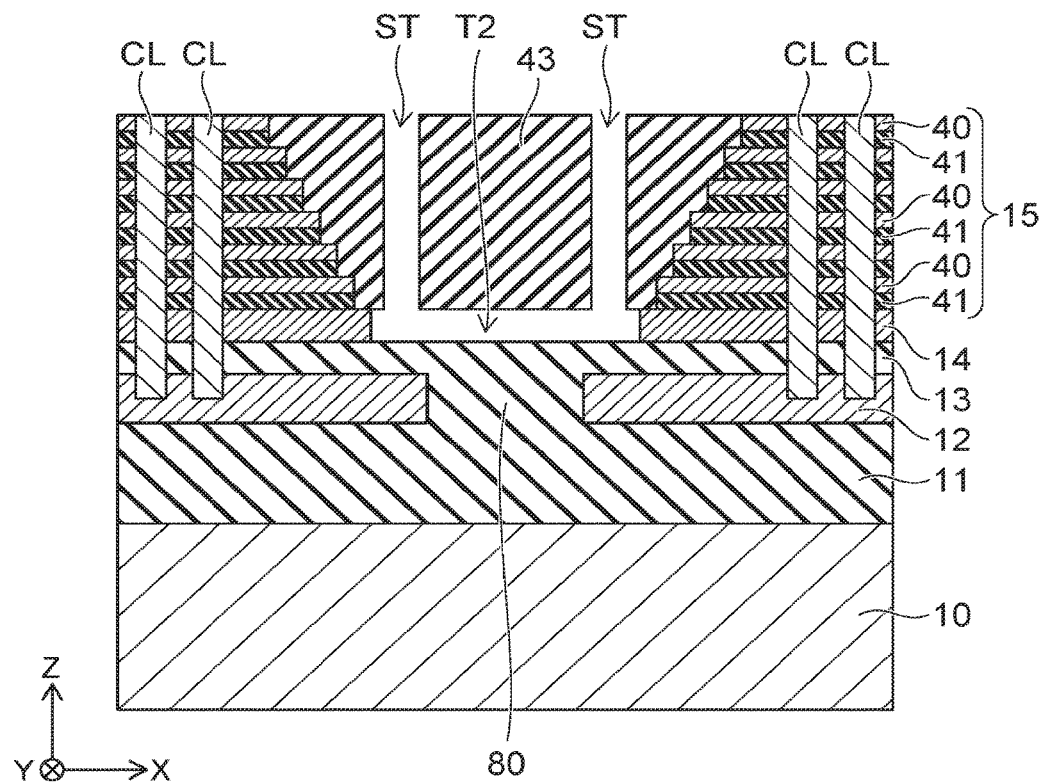

Subsequently, as shown in FIG. 24A and FIG. 24B, by performing wet etching through the slit ST extending in the X-direction, the sacrifice film 72 is removed. By removing the sacrifice film 72, a cavity is formed, and a metal such as tungsten is deposited and buried in the cavity through the slit ST. By doing this, an electrode film 40 is formed, and a stacked body 15 including the insulating film 41 and the electrode film 40 is formed.

On the other hand, the sacrifice film 71b is removed through the slit ST extending in the Y-direction simultaneously with the removal of the sacrifice film 72. The slit ST is in contact with the sacrifice film 71b, and therefore, the sacrifice film 71b is removed through the slit ST. By removing the sacrifice film 71b, the trench T2 is formed.

Figure 25A:
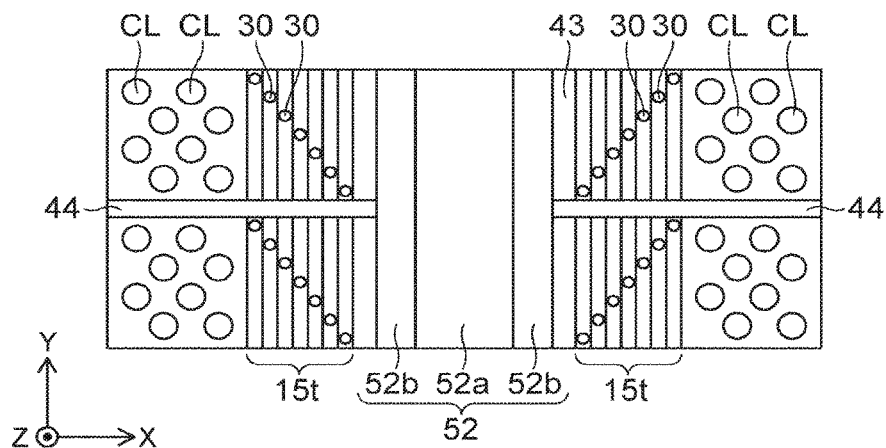
FIG. 25A and FIG. 25B are plan and sectional views showing the method for manufacturing the semiconductor memory device according to the second embodiment.
Figure 25B:
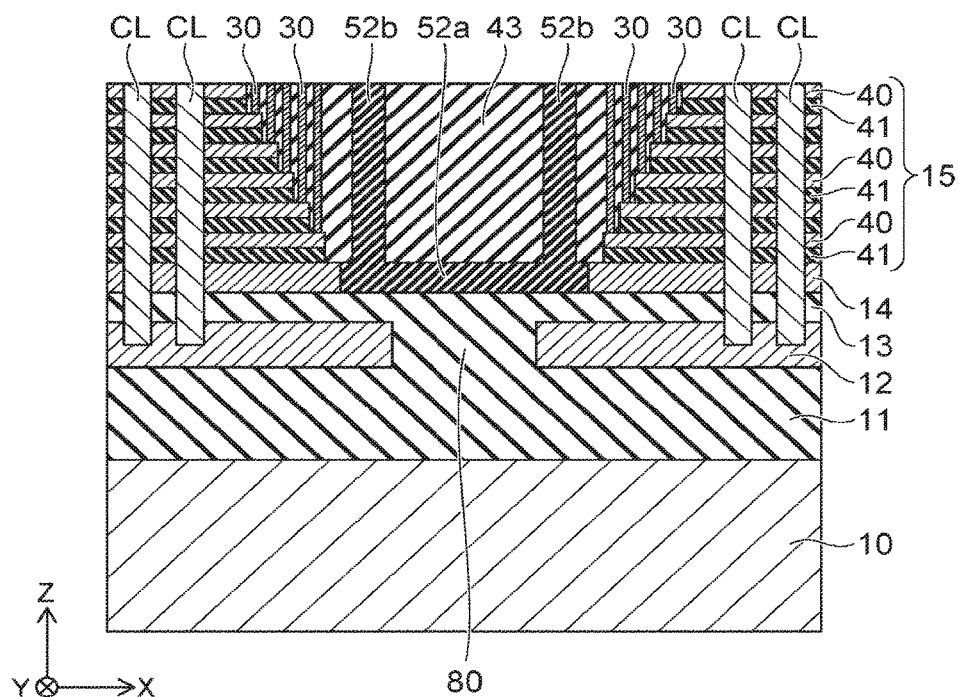

Subsequently, as shown in FIG. 25A and FIG. 25B, an insulating film 44 is formed in the slit ST extending in the X-direction.

On the other hand, an insulating member 52 is formed by burying silicon oxide or the like in the slit ST and the trench T2 extending in the Y-direction. By doing this, the conductive films 14 adjacent to each other in the X-direction are insulated from each other by the insulating member 52. In the insulating member 52, a portion buried in the trench T2 corresponds to the first portion 52a, and a portion buried in the slit ST corresponds to the second portion 52b. Incidentally, it is not necessary to bury silicon oxide or the like in the trench T2 and the slit ST, and in this case, as shown in FIG. 24A and FIG. 24B, a gap is formed in the insulating film 43.

Subsequently, a contact hole 74 is formed, and a contact 30 is formed in the contact hole 74.

In this manner, the semiconductor memory device 3 is manufactured.

In the semiconductor memory device 3 according to the embodiment, in the connection region Rc, the insulating member 52 including the first portion 52a and the second portion 52b is provided. Further, a width W5 in the X-direction of the first portion 52a is larger than a width W6 in the X-direction of the second portion 52b.

Further, in the embodiment, as in the process shown in FIG. 23A and FIG. 23B, the conductive film 12 is electrically connected to the bevel portion Bp by the sacrifice film 71b and the insulating film 13. That is, the insulating film 13 is provided between the sacrifice film 71b and the conductive film 12, however, by decreasing the insulation breakdown voltage of the insulating film 13, a current passes through the insulating film 13 at a low voltage, and therefore, the conductive film 12 can be electrically connected to the bevel portion Bp by the sacrifice film 71b and the insulating film 13. Then, by exposing a wide area to plasma in the bevel portion Bp, the potential of the conductive film 12 is made equal to that of the substrate 10, and thus, the electrical breakdown of the insulating film 11 is suppressed, and the generation of discharge Ar is suppressed.

The effects other than the above-mentioned effect of the embodiment are the same as those of the above-mentioned first embodiment.

According to the embodiment described above, a semiconductor memory device having high reliability and a method for manufacturing the same are provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a substrate;
an insulating film provided on the substrate;
a plurality of conductive films provided on the insulating film;
an insulating member provided on the insulating film, positioned between the plurality of conductive films in a first direction along the substrate, and extending in a second direction along the substrate, the second direction crossing the first direction;
a plurality of stacked bodies provided on the plurality of conductive films, and including a plurality of electrode films stacked separately from each other; and
a first member provided on the insulating member, positioned between the plurality of stacked bodies in the first direction, and extending in a stacking direction of the plurality of electrode films,
a width in the first direction of the insulating member being larger than a width in the first direction of the first member.

2. The device according to claim 1, wherein the first member contains an insulating material.

3. The device according to claim 1, wherein the insulating member and the first member contain silicon oxide.

4. The device according to claim 1, wherein the insulating member and the first member contain silicon nitride.

5. The device according to claim 1, wherein the first member contains a conductive material.

6. The device according to claim 1, wherein the first member contains tungsten.

7. The device according to claim 1, wherein a part of the insulating member is positioned in the insulating film.

8. The device according to claim 1, wherein
the insulating member has a plate shape, and
the first member has a columnar shape.

9. The device according to claim 1, wherein
the plurality of conductive films and the insulating member are alternately disposed along the first direction, and
a part of each of the plurality of conductive films positioned on an end portion of the substrate is exposed.

10. The device according to claim 1, further comprising:
a columnar portion provided in the plurality of stacked bodies and including a channel extending in the stacking direction,
wherein one of the plurality of stacked bodies includes a portion in a stepped shape with a terrace formed for each of the plurality of electrode films between the first member and the columnar portion.

* * * * *